United States Patent
Degraye et al.

(10) Patent No.: US 11,631,398 B2
(45) Date of Patent: *Apr. 18, 2023

(54) VOICE AWARE AUDIO SYSTEM AND METHOD

(71) Applicant: HED Technologies Sarl, Geneva (CH)

(72) Inventors: Timothy Degraye, Geneva (CH); Liliane Huguet, Geneva (CH)

(73) Assignee: HED Technologies SARL, Geneva (CH)

( * ) Notice: Subject to any disclaimer, the term of this patent is extended or adjusted under 35 U.S.C. 154(b) by 73 days.

This patent is subject to a terminal disclaimer.

(21) Appl. No.: 17/386,438

(22) Filed: Jul. 27, 2021

(65) Prior Publication Data
US 2021/0358482 A1 Nov. 18, 2021

Related U.S. Application Data

(63) Continuation of application No. 16/213,469, filed on Dec. 7, 2018, now Pat. No. 11,074,906.
(Continued)

(51) Int. Cl.
| | |
|---|---|
| *G10L 15/14* | (2006.01) |
| *G10L 15/20* | (2006.01) |
| *H04R 1/40* | (2006.01) |
| *H04R 3/00* | (2006.01) |
| *G06F 17/14* | (2006.01) |
| *G10L 15/08* | (2006.01) |

(52) U.S. Cl.
CPC ............ *G10L 15/14* (2013.01); *G06F 17/142* (2013.01); *G10L 15/20* (2013.01); *H04R 1/406* (2013.01); *H04R 3/005* (2013.01); *G10L 2015/088* (2013.01)

(58) Field of Classification Search
USPC ............... 704/231, 233, 246, 247, 251, 252
See application file for complete search history.

(56) References Cited

U.S. PATENT DOCUMENTS

| | | |
|---|---|---|
| 5,257,420 A | 11/1993 | Byrne, Jr. |
| 6,888,950 B2 | 5/2005 | Siskin et al. |
| | (Continued) | |

FOREIGN PATENT DOCUMENTS

| | | |
|---|---|---|
| CN | 2528177 | 12/2002 |
| CN | 101142797 | 3/2008 |
| | (Continued) | |

OTHER PUBLICATIONS

European Patent Application No. 15873755.1, Partial Search Report dated Aug. 8, 2018.
(Continued)

*Primary Examiner* — Leonard Saint-Cyr
(74) *Attorney, Agent, or Firm* — Foundation Law Group LLP; JD Harriman

(57) ABSTRACT

A voice aware audio system and a method for a user wearing a headset to be aware of an outer sound environment while listening to music or any other audio source. An adjustable sound awareness zone gives the user the flexibility to avoid hearing far distant voices. The outer sound can be analyzed in a frequency domain to select an oscillating frequency candidate and in a time domain to determine if the oscillating frequency candidate is the signal of interest. If the signal directed to the outer sound is determined to be a signal of interest the outer sound is mixed with audio from the audio source.

23 Claims, 23 Drawing Sheets

Related U.S. Application Data

(60) Provisional application No. 62/595,627, filed on Dec. 7, 2017.

(56) References Cited

U.S. PATENT DOCUMENTS

| | | |
|---|---|---|
| 7,970,159 B2 | 6/2011 | Kleinschmidt et al. |
| RE43,872 E | 12/2012 | Trip et al. |
| 8,340,058 B2 | 12/2012 | Vedurmudi |
| 8,811,629 B1 | 8/2014 | Kulavik et al. |
| 2004/0156012 A1 | 8/2004 | Jannard et al. |
| 2006/0205349 A1 | 9/2006 | Passier |
| 2007/0042762 A1 | 2/2007 | Guccione |
| 2007/0160249 A1 | 7/2007 | LeGette et al. |
| 2007/0287380 A1 | 12/2007 | Hui et al. |
| 2008/0090524 A1 | 4/2008 | Lee et al. |
| 2008/0096531 A1 | 4/2008 | McQuaide et al. |
| 2008/0157991 A1 | 7/2008 | Raghunrath et al. |
| 2008/0175403 A1 | 7/2008 | Tan |
| 2008/0177972 A1 | 7/2008 | Tan |
| 2008/0181419 A1 | 7/2008 | Goldstein et al. |
| 2008/0201138 A1 | 8/2008 | Visser et al. |
| 2008/0212791 A1 | 9/2008 | Asada et al. |
| 2009/0097672 A1 | 4/2009 | Bull et al. |
| 2009/0109940 A1 | 4/2009 | Vedurmudi |
| 2009/0186668 A1 | 7/2009 | Rahman et al. |
| 2009/0208923 A1 | 8/2009 | Gelfand |
| 2009/0209304 A1 | 8/2009 | Ngia et al. |
| 2009/0257615 A1 | 10/2009 | Bayer, Jr. |
| 2010/0040240 A1 | 2/2010 | Bonanno |
| 2010/0048134 A1 | 2/2010 | McCarthy |
| 2010/0166243 A1 | 7/2010 | Siskin |
| 2010/0279608 A1 | 11/2010 | Shi-En |
| 2010/0296668 A1 | 11/2010 | Lee et al. |
| 2010/0299639 A1 | 11/2010 | Ramsay |
| 2010/0308999 A1 | 12/2010 | Chornenky |
| 2011/0288860 A1 | 11/2011 | Schevciw |
| 2012/0082335 A1 | 4/2012 | Duisters et al. |
| 2012/0120270 A1 | 5/2012 | Li et al. |
| 2012/0128175 A1 | 5/2012 | Visser et al. |
| 2012/0237053 A1 | 9/2012 | Alam et al. |
| 2013/0038458 A1 | 2/2013 | Toivola et al. |
| 2013/0108071 A1 | 5/2013 | Huang et al. |
| 2013/0124204 A1 | 5/2013 | Wong et al. |
| 2013/0148818 A1 | 6/2013 | Yamkovoy |
| 2013/0208923 A1 | 8/2013 | Suvanto |
| 2013/0214998 A1 | 8/2013 | Andes et al. |
| 2013/0279705 A1 | 10/2013 | Wong et al. |
| 2013/0279715 A1 | 10/2013 | Tan |
| 2013/0316642 A1 | 11/2013 | Newham |
| 2013/0322424 A1 | 12/2013 | Fraser |
| 2013/0339859 A1 | 12/2013 | Hardi |
| 2014/0126735 A1 | 5/2014 | Gauger, Jr. |
| 2014/0133669 A1 | 5/2014 | Klinghult |
| 2014/0143343 A1 | 5/2014 | Edholm |
| 2014/0185828 A1 | 7/2014 | Helbling |
| 2014/0198778 A1 | 7/2014 | Fraser |
| 2014/0269425 A1 | 9/2014 | Fisher et al. |
| 2014/0270228 A1 | 9/2014 | Oishi |
| 2014/0273851 A1 | 9/2014 | Donaldson et al. |
| 2015/0117659 A1 | 4/2015 | Kirsch |
| 2015/0249898 A1 | 9/2015 | Horbach |
| 2015/0287422 A1 | 10/2015 | Short et al. |
| 2015/0294662 A1 | 10/2015 | Ibrahim |
| 2016/0125869 A1 | 5/2016 | Kulavik |
| 2016/0150575 A1 | 5/2016 | Andersen et al. |
| 2016/0165336 A1 | 6/2016 | Di Censo et al. |
| 2016/0241947 A1 | 8/2016 | Degraye et al. |
| 2017/0142511 A1 | 5/2017 | Dennis |
| 2020/0314646 A1 | 10/2020 | Dean-Bhiyan et al. |

FOREIGN PATENT DOCUMENTS

| | | |
|---|---|---|
| CN | 101640552 | 2/2010 |
| CN | 102893331 | 1/2013 |
| CN | 103414982 | 11/2013 |
| CN | 103686516 | 3/2014 |
| CN | 104053253 | 9/2014 |
| JP | 2003-023479 | 1/2003 |
| JP | 2009-135960 | 6/2009 |
| JP | 2012-039624 | 2/2012 |
| JP | 2012-524917 | 10/2012 |
| KR | 10-0782083 | 12/2007 |
| KR | 10-2009-0103953 | 10/2009 |
| TW | 200937196 | 9/2009 |
| WO | 2008130328 | 10/2008 |
| WO | 2015134333 | 9/2015 |
| WO | 2016209295 | 12/2016 |

OTHER PUBLICATIONS

European Patent Application No. 15873755.1, Search Report dated Jan. 2, 2019.
International Application No. PCT/US2015/000164, International Search Report dated Apr. 22, 2016.
International Application No. PCT/US2015/000164, Written Opinion dated Apr. 22, 2016.
Japanese Patent Application No. 2017-552787, Search Report dated Feb. 3, 2020, with English translation, 11 pages.
Canadian Patent Application No. 2,971,147, Search Report dated Apr. 6, 2020, 3 pages.
Sahidullah et al, "Comparison of Speech Activity Detection Techniques for Speaker Recognition", Oct. 1, 2012 (retrieved from https://arxiv.org/pdf/1210.0297.pdf, May 21, 2019), 7 pages.

VOICE AWARE AUDIO SYSTEM AND METHOD

CROSS REFERENCE TO RELATED APPLICATIONS

The present application is a continuation of U.S. patent application Ser. No. 16/213,469, filed Dec. 7, 2018, entitled "Voice Aware Audio System and Method, now U.S. Pat. No. 11,074,906, which claims the benefit of U.S. Provisional Application Ser. No. 62/595,627 filed Dec. 7, 2017, entitled "Unity Voice Aware Audio System," which are hereby incorporated by reference herein.

BACKGROUND OF THE INVENTION

Field of the Invention

The present invention relates to a system and method for a user wearing a headset to be aware of an outer sound environment while listening to music or any other audio source.

Description of Related Art

Voice activity detection (VAD), also known as speech activity detection or speech detection, is a technique used in speech processing in which the presence or absence of human speech is detected. Various VAD algorithms are known. Conventional algorithmic solutions used for VAD are known to suffer from the problem of a poor detection score when the input signal is noisy.

VAD plays a role in many speech processing applications including speech recognition, speech compression and noise reduction systems. In FIG. 1, a basic principle of conventional VAD is depicted which consists of extracting features from a framed input signal then, on the basis of information grabbed from the last few frames, adapting a multi-dimension threshold and proceeding to a comparison of the features with this threshold in order to decide whether the frame is speech or noise. In general, there is typically a final stage of decision hangover which objective is to ensure a continuous speech stream which includes the normal short silent periods that happen in a sentence. Frame lengths are in general chosen to be between 10 and 40 ms duration as this corresponds to a time window where speech can be considered statistically stationary.

A criterion to detect speech is to look for voiced parts as those are periodic and have a mathematical well-defined structure that can be used in an algorithm. Another approach is to use a statistical model for speech, estimate its parameters from acquired data samples and use the classic results of decision theory to get to the frame speech/noise classification.

FIG. 2 illustrates techniques which have been used in time-domain methods to detect speech. The techniques include short-time energy, zero-crossing rate, cross-correlation, periodicity measure, linear prediction analysis and pitch estimation. FIG. 3 illustrates techniques which have been used in frequency-domain methods to detect speech. The techniques include sub-band energies, Weiner entropy, Cepstrum, energy entropy, harmonicity ratio and spectrum peak analysis. Conventional VAD algorithms use either time or frequency domains features or use statistical or other particular algorithmic mechanisms. Some conventional VADs use a collection of features including long-term spectral divergence, cepstral peak, MEL-filtered spectrum and spectro-temporal modulation in either a time domain or a frequency domain.

It is known that VAD performance decreases when an amount of noise increases. Conventional solutions are to have the VAD system preceded by a noise reduction (NR) module. One known limitation when pre-processing a speech signal with noise reduction (NR) is the potential appearance of musical noise which added to the input signal may mislead the VAD module and creates false detections.

Another drawback with the use of conventional NR modules is the difficulty and even the impossibility to set internal parameters to allow the system to work correctly for different noise levels and categories. As an example, if one chooses a set of internal parameters to tackle a very noisy environment, then relatively important distortions will appear in silent and quiet environments.

To overcome the above drawbacks which not only impact the audio quality but may even harm the VAD module performance, it is desirable to provide an improved mechanism for detecting a noise level environment and allow the dynamic setting of the NR internal parameters.

It is desirable to provide an improved noise-robust VAD method and a system for allowing a user to be aware of an outer sound environment while listening to music or any other audio source.

SUMMARY OF THE INVENTION

The present invention relates to a voice aware audio system and a method for a user wearing a headset to be aware of an outer sound environment while listening to music or any other audio source. The present invention relates to a concept of an adjustable sound awareness zone which gives the user the flexibility to avoid hearing far distant voices. The system of the present invention can use features of a headphone as described in US Patent Publication Number 2016/0241947 hereby incorporated by reference into this application. In one embodiment, the headphone includes a microphone array having four input microphones. This provides spatial sound acquisition selectivity and allows the steering of the microphone array towards directions of interest. Using beamforming methods and combining with different technologies like noise reduction systems, fractional delay processing and a voice activity detection (VAD) algorithm of the present invention, a new audio architecture is provided with improved performance in noisy environments.

The present invention includes different signal processing modules including noise reduction and array processing. In particular, a procedure is provided which estimates the noise level which is referred to as Noise Sensing (NS). This procedure adapts parameters of a noise reduction so that output sound quality is optimized. Once voice has been detected, the user can be alarmed via a headphone signal without disrupting the music or other audio source that the user was listening to. This is done by mixing the external voice with the headphone lead signal. A mixing mechanism is used which can take into account psychoacoustic properties and allow final mixing without reducing a volume of the music signal while maximizing at the same time intelligibility.

Typical applications of the voice awareness audio system of the present invention can appear within the following scenarios: voice, for example a person shouting, talking or calling, a baby crying, public transport announcements; bells and alarms, for example someone ringing a door bell, a door bell activated for a package delivery, house, car and other alarms; and others, for example a car horn, police and ambulance air-raid siren, and whistles The invention will be more fully described by reference to the following drawings.

DETAILED DESCRIPTION

Figure 1:
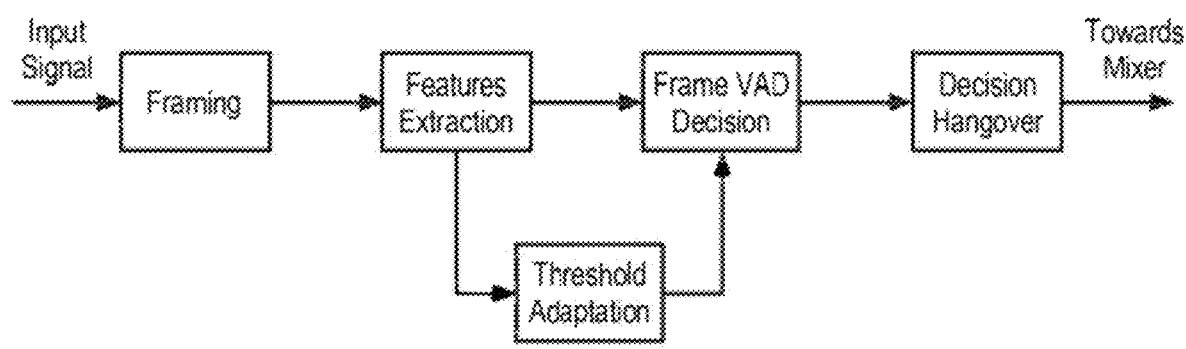
FIG. 1 is a schematic diagram of prior art principles in voice activity detection (VAD).
Figure 2:
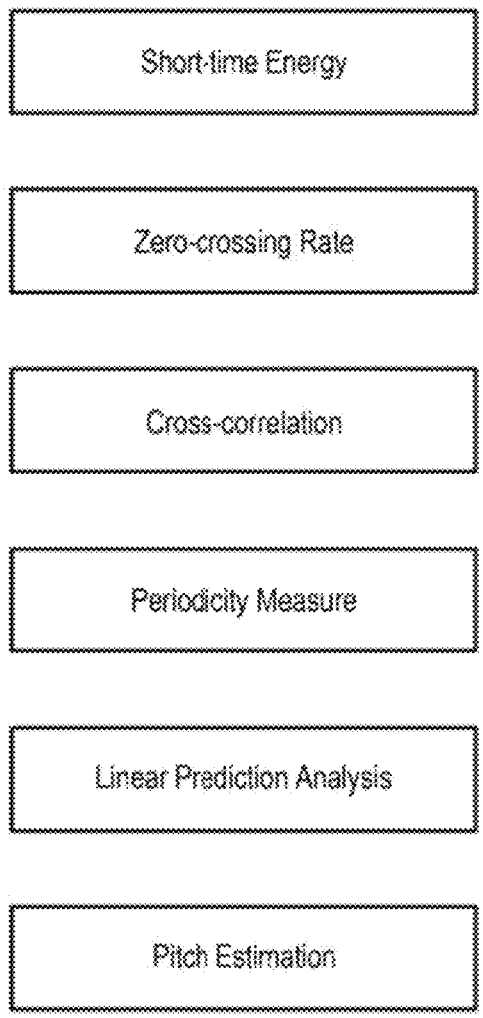
FIG. 2 is a schematic diagram of example prior art time-domain speech detection techniques.
Figure 3:
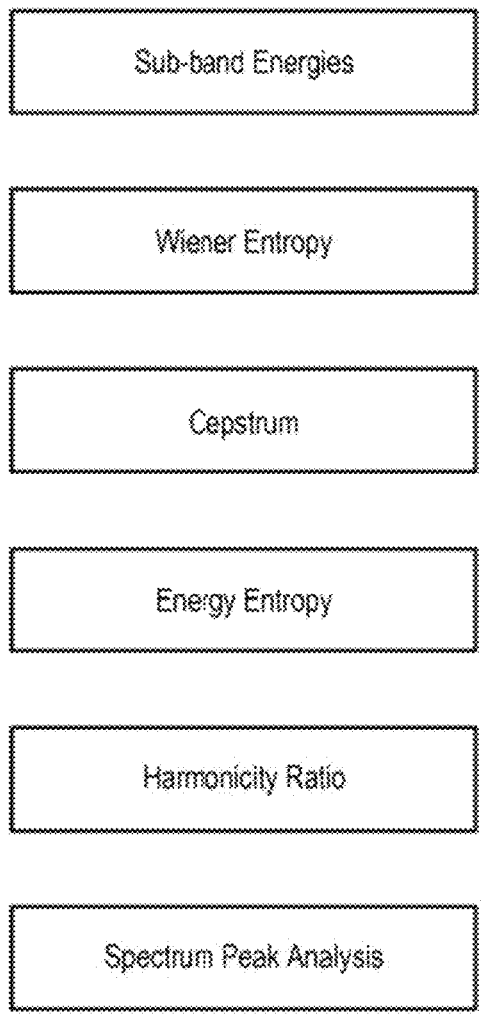
FIG. 3 is a schematic diagram of example prior art frequency-domain speech detection techniques.

Reference will now be made in greater detail to a preferred embodiment of the invention, an example of which is illustrated in the accompanying drawings. Wherever possible, the same reference numerals will be used throughout the drawings and the description to refer to the same or like parts.

The voice aware audio system of the present invention allows any user wearing a headphone to be aware of the outer sound environment while listening to music or any other audio source. In one embodiment, the voice aware audio system can be implemented as a headphone which has 4 input microphones as described for example in US Patent Publication No. 2016-0241947. The user will be prompted by hearing a voice or a set of defined sounds of interest when the signal coming from the headphone microphone is recognized to be a desired signal. When the signal coming from the microphone is not analyzed to be a voice or any signal of interest, the listener will not be disrupted by the microphone signal and will just hear the lead signal.

Figure 4A:
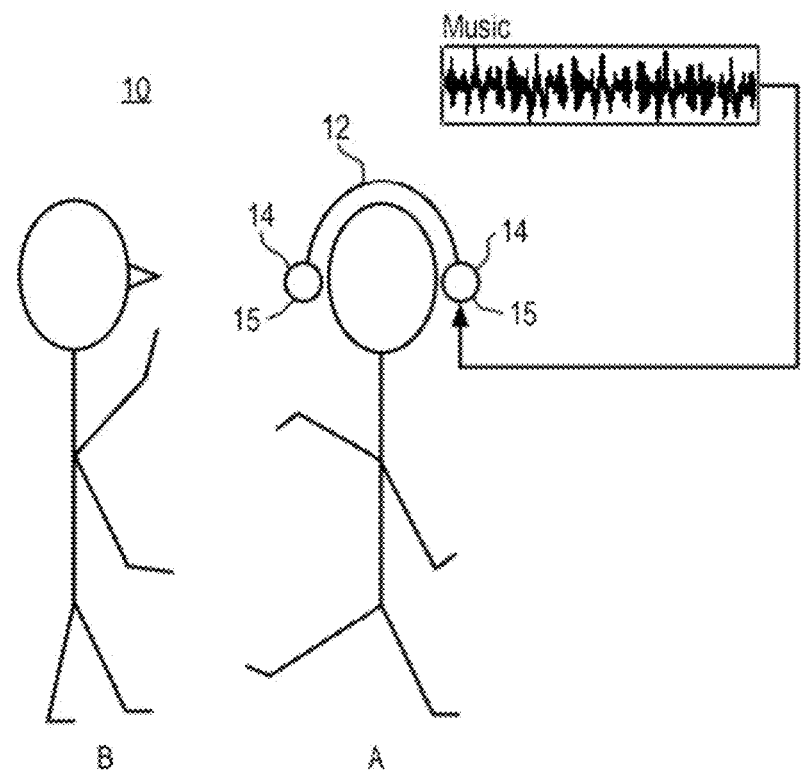
FIGS. 4A and 4B illustrate a schematic diagram of a voice aware audio system in which an external voice of interest is mixed with user music in accordance with the teachings of the present invention.
Figure 4B:
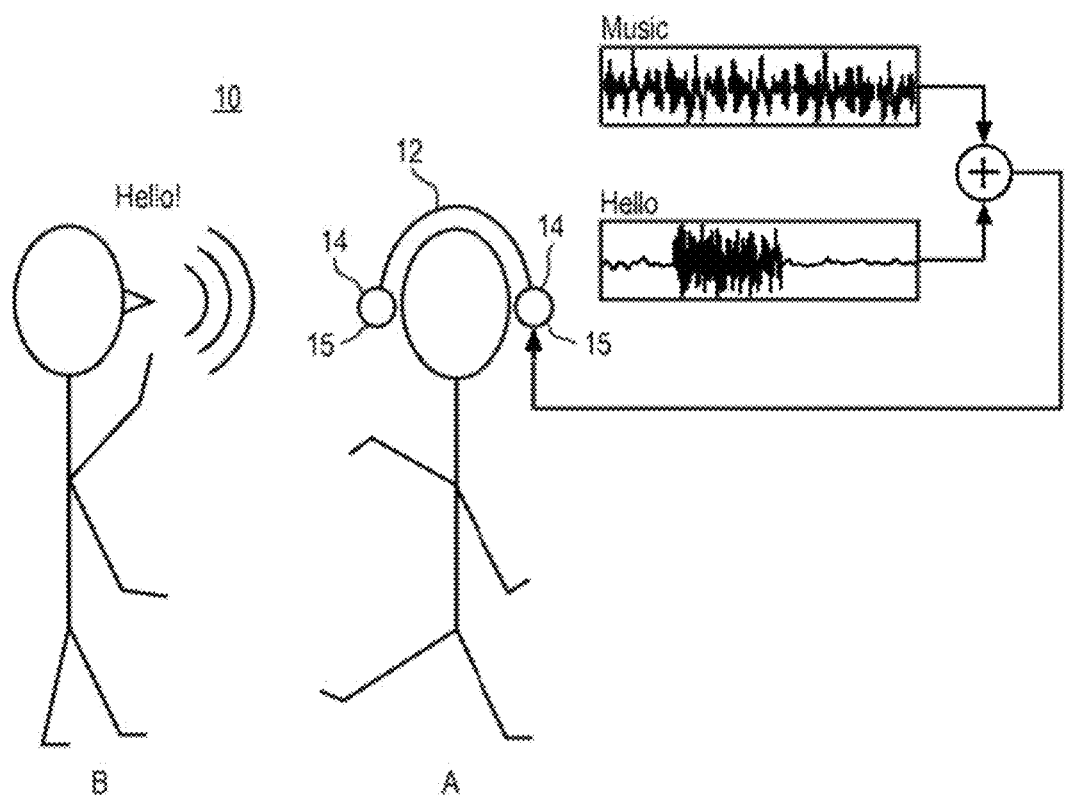

FIGS. 4A and 4B illustrate a possible scenario for voice aware audio system 10 as person B comes towards person A who is wearing headphone 12 and listens to music or watches a television screen or the like with audio output. As soon as person B talks to person A, voice will be detected through one or more microphones 15 arranged in ear pads 14 and mixed with a lead signal so that person A will be aware of the speech message spoken by person B. In order not to be disarranging, the outer sound needs to be mixed with music only when the outer sound is desirable, such as human voice. Voice aware system 10 can also detect other typical sounds for example, alarms, rings, horns, alarms, sirens, bells and whistles.

Figure 5:
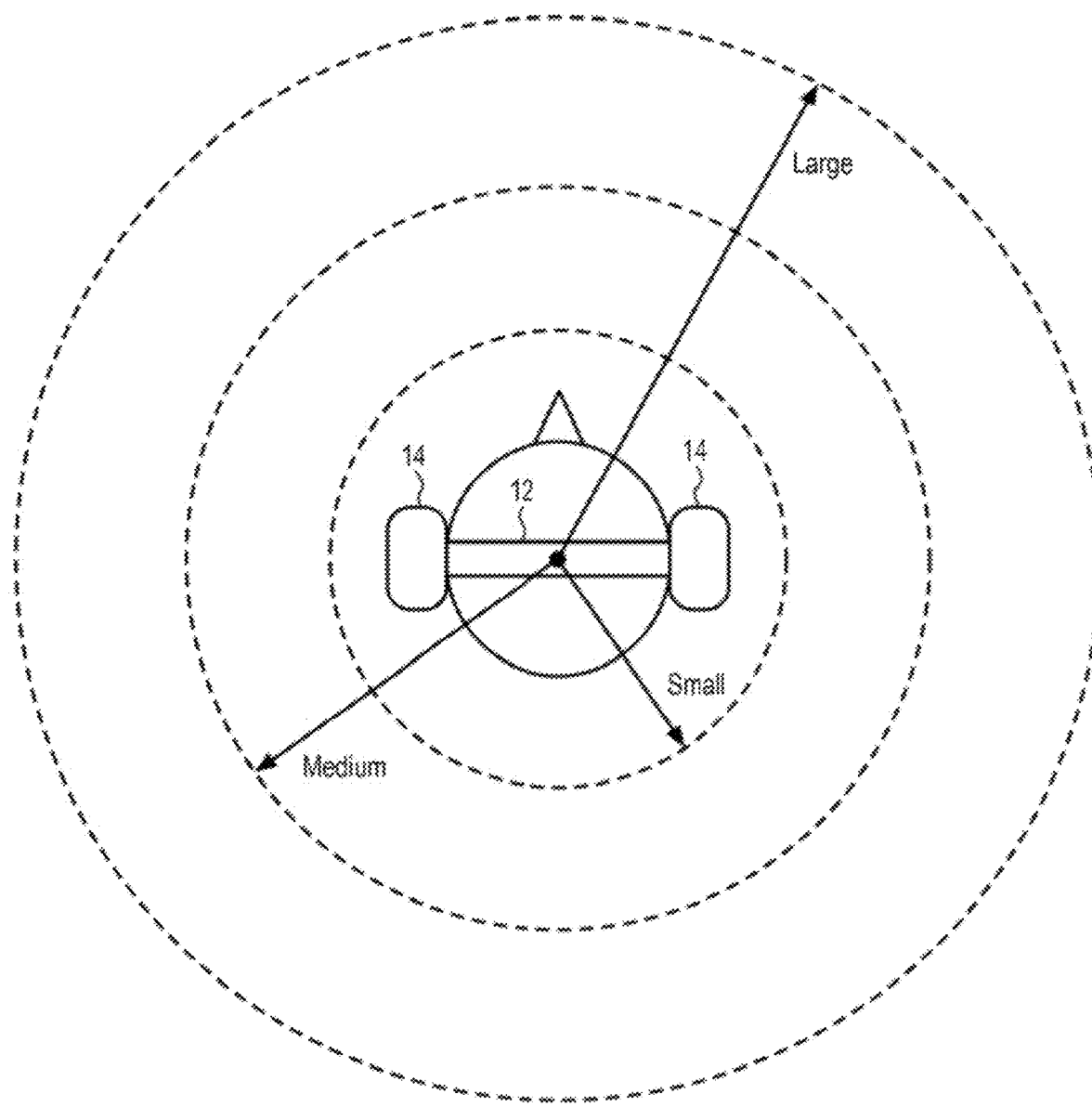
FIG. 5 is a schematic diagram of an adjustable sound awareness zone used in the voice aware audio system of the present invention.

A sub-system called Adjustable Sound Awareness Zone (ASAZ) can be used with voice aware audio system 10 as depicted in FIG. 5. The user has the ability to define a variable sphere radius around their head through an Application Program Interface (API) associated with headphone 12 so that voice aware system 10 reacts only to normal voices, no whispering, which are inside a defined sphere radius. Any other normal voice, no shouting, situated outside the defined sphere will not be detected. Three levels of tuning of voice aware system 12 can be been defined as:

large, medium and small. A large tuning corresponds to radius RL having a large length, a medium tuning corresponds to radius RM having a medium length which is smaller than radius RL and a small tuning corresponds to radius RS having a small length which is smaller than radius RM. For example, radius RL can have a length in the range of about 75 feet to about 30 feet, radius RM can have a length in the range of about 50 feet to about 20 feet and radius RS can have a length in the range of about 25 feet to about one foot.

Referring to FIGS. 4A and 4B, voice aware audio system 10 includes a Noise Reduction (NR) method or Noise Reduction (NR) algorithm to estimate the noise level so that voice aware audio system 10 can tune quickly to any of the internal parameters of the noise reduction (NR) algorithm. This provides the best audio quality for a wide range of noise levels. This procedure referred to as Noise Sensing (NS) is used also to tune dynamically sensitive thresholds or other internal parameters and achieve better performance.

Figure 6:
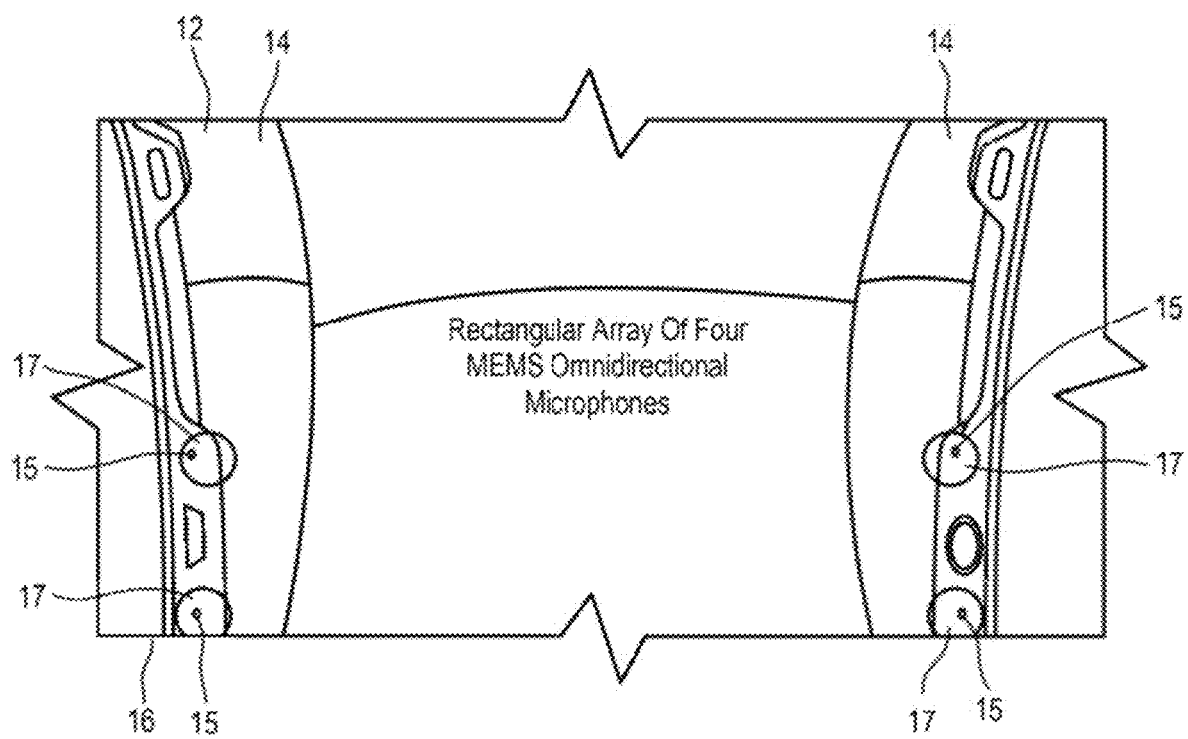
FIG. 6 is a schematic diagram of a microphone array used in a headphone of the present invention.

In one embodiment, headphone 12 has one or more omni-directional microphones 15 located in ear pads 14. Headphone 12 can include four omni-directional microphones 15 as shown in FIG. 6. Headphone 12 is fitted with a rectangular or trapezoidal array of four omnidirectional microphones 15. The configuration allows the use of different virtual directive/cardioid microphones, by pairs in a line or even combining elements on the diagonal. Omni-directional microphones 15 are located in lower portion 16 of ear pads 14, mounted in a specific position in order to achieve a 360° audio image of the environment around the user. Using an array processing algorithm a localization of interest such as a speaker's location is determined. Once localization has been performed, the user can easily point the equivalent antenna radiation pattern towards that direction. Doing so, the noise energy at omni-directional microphone(s) 15 can be reduced and the external voice will be enhanced. Impact of beamforming can have a positive impact on the performances of noise reduction as described below. One or more speakers 17 can be associated with microphones 15. In alternate embodiments, headphone 12 can include any type of speaker array associated with an type of structure.

Figure 7:
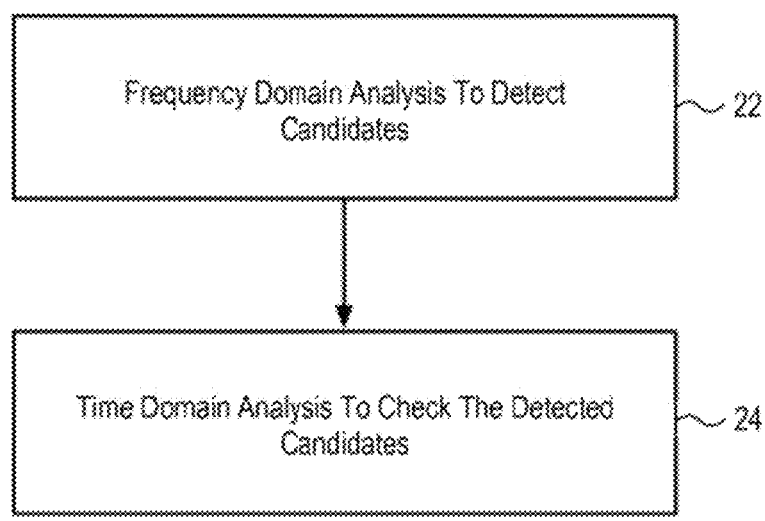
FIG. 7 is a flow diagram of a method for voice activity detection in accordance with the teachings of the present invention.

FIG. 7 is a schematic diagram of a method for voice activity detection 20 which can be implemented in voice aware audio system 10. The implementation of the present invention is to use both frequency and time domains. In block 22, a frequency domain can be used for detecting periodic patterns. Block 22 can be referred to as a first guess step. Block 22 is a coarse decision process where the objective is to select potential oscillating frequency candidates. After block 22, block 24 can be performed. Block 24 can be a time-domain procedure in order to check if the selected oscillating frequency candidate is confirmed or not. For the frequency domain guess step in block 22, and in order to be noise-resistant, large buffers can be used and a relatively low threshold in order to minimize the rate of false negative decisions. If the detected oscillating frequency candidate is false, the second and final decision process in block 24 is performed in the time domain using recursively results of a time domain algorithm analysis running on sub-frames within the frame used for the frequency domain first step analysis.

In an implementation of block 22, Wiener entropy or spectral flatness is used in order to reduce the computational burden of the two successive procedures. The FFT of the input buffer can also be used for noise reduction as described below.

In an implementation of block 24 a pitch estimation algorithm is used. In one embodiment, the pitch estimation algorithm is based on a robust YIN algorithm. The estimation process can be simplified into a detection-only process or the complete algorithm can be used ensuring continuity of the estimated pitch values between successive frames to render the algorithm even more robust against errors.

Successive decisions over subframes in a frame plus overlapping between the large frame provides an increase in the accuracy of the algorithm, referred to as the WEYIN (Wiener Entropy YIN) algorithm.

In one embodiment for VAD, the method can be done with different combinations of features in frequency domain in block 22 to detect potential pitch voiced frames candidates that will be re-analyzed in time-domain in block 24.

The Wiener entropy given as:

$$w^B(k) = (\Pi_{l \in B} X^f(l,k))^{1/N} \Big/ \left(\frac{1}{N} \Sigma_{l \in B} X^f(l,k)\right)$$

can be computed using:

$$\left(\prod_{l \in B} |X^f(l,k)|\right)^{1/N} =$$

$$\exp\left(\log\left(\prod_{l \in B} |X^f(l,k)|\right)^{1/N}\right) = \exp\left(\frac{1}{N}\sum_{l \in B} \log|X^f(l,k)|\right).$$

This leads to the following equation:

$$w_B(k) = \exp\left(\frac{1}{N}\sum_{l \in B} \log|X^f(l,k)|\right) \Big/ \left(\frac{1}{N}\sum_{l \in B} |X^f(l,k)|\right),$$

The Wiener entropy can be computed in different bands $B_i$, $i=1, \ldots, L$. So that, the candidate selection process is done through the computation of the L scalar quantities:

$$w^{B_i}(k) = \exp\left(\frac{1}{N}\sum_{l \in B_i} \log|X^f(l,k)|\right) \Big/ \left(\frac{1}{N}\sum_{l \in B_i} \log|X^f(l,k)|\right),$$

$$i = 1, \ldots, L,$$

Which are sent to the selection process after a threshold decision step:

$$w^{B_i}(k) \gtrless \eta_i, \ i=1, \ldots, D.$$

Once the frame has been designed as a candidate for speech presence, the time-domain inspection begins in block 24. The YIN algorithm can be used over K subframes of length M such that:

N=KM, where:

$N=2^L$, is the frame length used in the spectrum-domain and chosen to be a power of 2, in order to be able to use the FFT.

Yin algorithm is turned from a pitch estimation algorithm to a pitch detection one. For that purpose, a frequency band $[F^p_{min}, F^p_{max}]$ is defined corresponding to minimum and maximum expected pitch frequency values which leads to the time values interval [τmin,τmax]:

$$\tau_{min} = \lfloor F_S/F_{max}^P \rfloor \text{ and } \tau_{max} = \lceil F_S/F_{min}^P \rceil,$$

where $F_s$ is the sampling frequency which can be a fraction of the original sampling frequency used for the processing in the frequency domain, $\lfloor \ \rfloor$ and $\lceil \ \rceil$ are respectively the floor and ceiling rounding operators. As an example, if $[F_{min}^P, F_{max}^P]=[70, 400]$ Hz and $F_s=8$ kHz, then $[\tau_{min}, \tau_{max}]=[20, 115]$.

The following matrix of time delays lags is defined:

$$\Delta = \begin{bmatrix} \langle \tau_{max}/2 \rangle + \langle (0:\tau_{max}-1)/2 \rangle \\ \langle \tau_{max}/2 \rangle - \langle (1:\tau_{max})/2 \rangle \end{bmatrix},$$

where $\langle \ \rangle$ is the rounding to the nearest integer operator and $(0:m)=(0\ 1\ 2\ \ldots\ m-1\ m)$. the example above is reconsidered:

$$\Delta = \begin{bmatrix} 59 & 59 & 59 & 60 & 60 & \ldots & 114 & 115 & 115 \\ 57 & 57 & 56 & 56 & 55 & \ldots & 1 & 1 & 0 \end{bmatrix}.$$

With this choice, computations of the YIN difference function will be done according to the lag values of the first and second rows of the matrix Δ. First column of this matrix will give the relative indices from which the difference function computation departs.

Over the present frame, a set of difference function values is defined taken over successive intervals of length H. They are organized in a matrix with number of rows and columns defined as:

$$\begin{cases} nRows = \left\lfloor \dfrac{N - \tau_{max}}{H} \right\rfloor \\ nCols = \tau_{max} \end{cases}$$

YIN difference matrix dd is defined by its generic element as:

$$dd(k, l) = \sum_{m=0}^{H-1} (x(\Delta(0, l) + kH + m) - x(\Delta(1, l) + kH + m))^2.$$

Consider then:

$$Dd(l) = \sum_{k=0}^{nRows-1} dd(k, l),$$

And the quantity:

$$Q_i = \sum_{l=0}^{nCols-1} Dd(l) = \sum_{l=0}^{nCols-1} \sum_{k=0}^{nRows-1} dd(k, l).$$

The algorithm resumes by computing:

$$Dn(l) = \frac{Dd(l)}{Q_i},$$

And looks for the minimum:

$$rr(i) = \min(Dn(\tau_{min}:\tau_{max})),$$

which is compared to a threshold:

$$rr(i) \gtreqless \varphi.$$

If this minimum is smaller than the threshold, decision of speech presence $\beta i=1$ for subframe i is taken.

Once decisions are done on the successive K subframes in the present frame, it is decided for the speech presence over the complete frame by proceeding to a majority vote:

$$\beta_k = \sum_{i=1}^{K} \beta_i \geq Q,$$

where Q may be chosen (but not restricted to) to be K/2.

In one embodiment a Wiener entropy simplification can be used in block 22.

In order to avoid the square root vectorial operation: $|X^f(l, k)| = \sqrt{\Re^2 X^f(l, k) + \Im^2 X^f(l, k)}$ which can be costly, are chosen to use:

$$w^\beta(k) = \exp\left(\frac{1}{N}\sum_{l \in B} \log S^f(l, k)\right) \bigg/ \left(\frac{1}{N}\sum_{l \in B} S^f(l, k)\right),$$

where:

$$S^f(l,k) = \Re^2 X^f(l,k) + \Im^2 X^f(l,k) = |X^f(l,k)|^2.$$

Figure 8A:
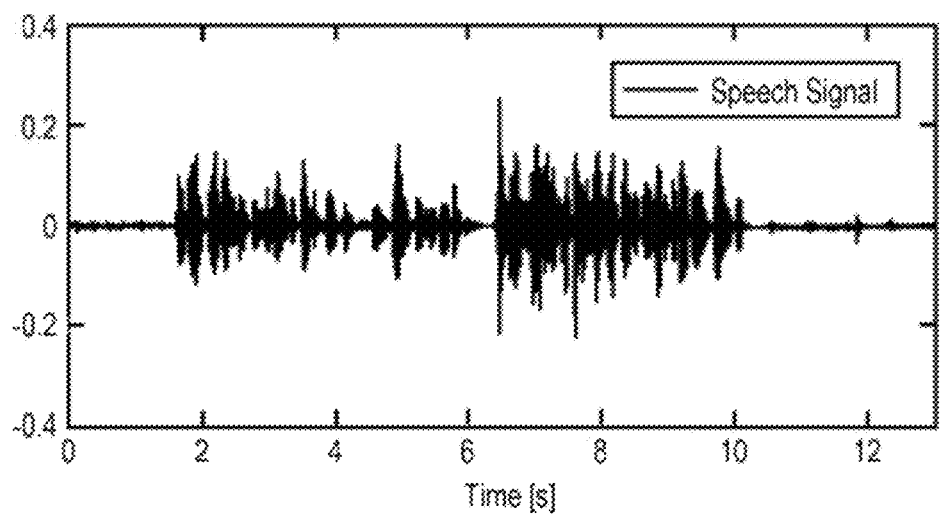
FIG. 8A is a schematic diagram of a speech signal.
Figure 8B:
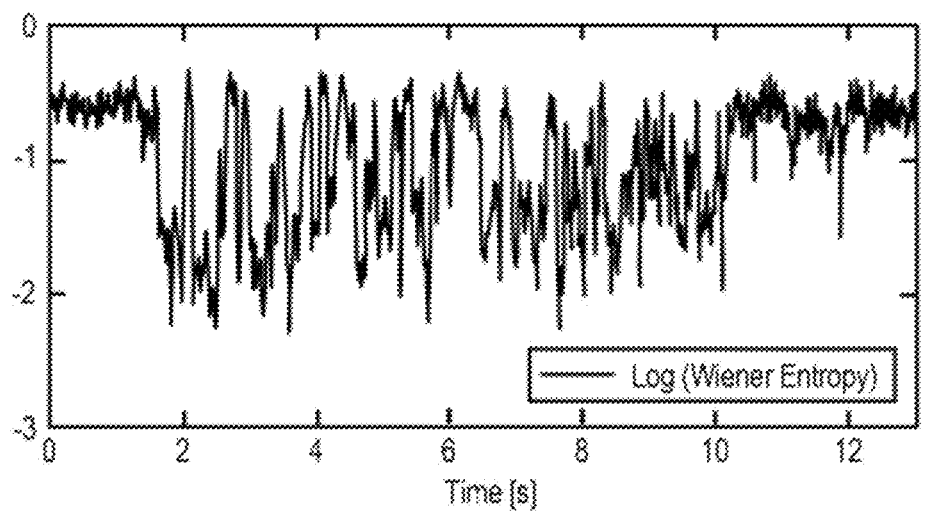
FIG. 8B is a schematic diagram of log weiner entropy.
Figure 8C:
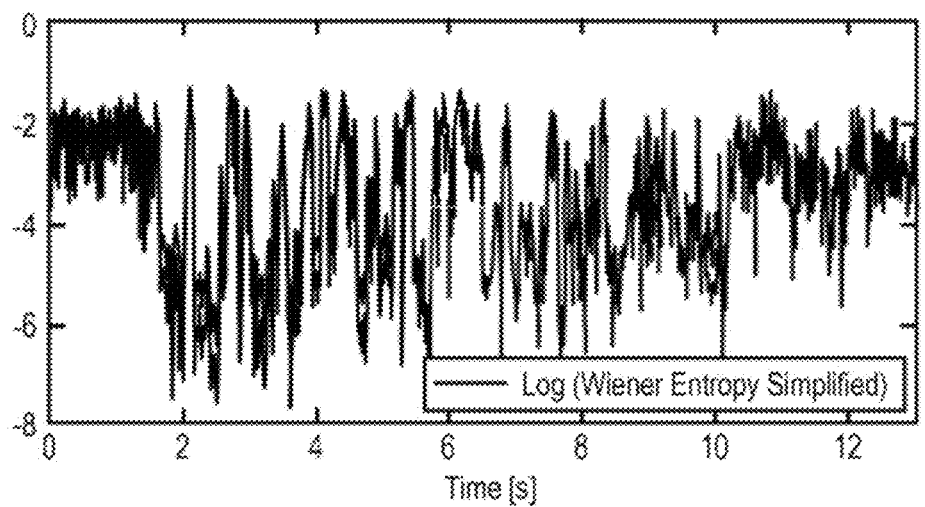
FIG. 8C is a schematic diagram of log wiener entropy simplified

FIG. 8A shows a speech signal. FIG. 8B shows a log of Weiner entropy. FIG. 8C shows a log of Weiner entropy simplified. The results indicate the Weiner entropy simplified is a valid indicator of voiced speech.

In one embodiment, a Yin simplification can be used in block 24.

For the time-domain part, the following YIN version can be used:

$$d_k^{YIN}(\tau) = \begin{cases} 1, & \text{if } \tau = 0 \\ d_k(\tau) \bigg/ \dfrac{1}{\tau}\sum_{j=1}^{\tau} d_k(j) & \text{else}, \end{cases}$$

where $d_k(\tau) = \sum_{n=k-N+1}^{k-N+H} |x(n) - x(n+\tau)|.$

In this last equation, the squared difference function is replaced by the absolute value in order to reduce the number of operations.

There exists an overlap of J samples between two successive frames (decision of speech presence is valid for the J first samples only).

If $r_k(i+1)$ is the k th row of the matrix $dd_{i+1}$ at time i+1, then we have:

$$dd_{i+1} = \begin{bmatrix} r_1(i+1) \\ r_2(i+1) \\ \vdots \\ r_{nRows-1}(i+1) \\ r_{nRows}(i+1) \end{bmatrix} = \begin{bmatrix} r_2(i) \\ r_3(i) \\ \vdots \\ r_{nRows}(i) \\ r_{nRows}(i+1) \end{bmatrix} = \begin{bmatrix} dd_i(2:nRows, :) \\ r_{nRows}(i+1) \end{bmatrix},$$

where $r_m(i+1)$ is the m th row of the matrix $dd_{i+1}$ and $dd_i(2:nRows,:)$ is the extracted matrix from dd associated to the present frame i, from row 2 to nRows.
From the previous equation, we deduce easily:

$$Dd_i^{+1} = \sum_{k=1}^{nRows} r_k(i+1) =$$

$$\sum_{k=2}^{nRows} r_k(i) + rnRows(i+1) = \sum_{k=1}^{nRows} r_k(i) - r_1(i) + rnRows(i+1),$$

$$Dd_{i+1} = Dd_i - r_1(i) + r_{nRows}(i+1).$$

Therefore, there is no need to compute all the elements of the matrix dd before computing the sum of its rows. Instead, the vector Dd(i) is updated by computing rnRows(i) and nnRows(i).

Figure 9:
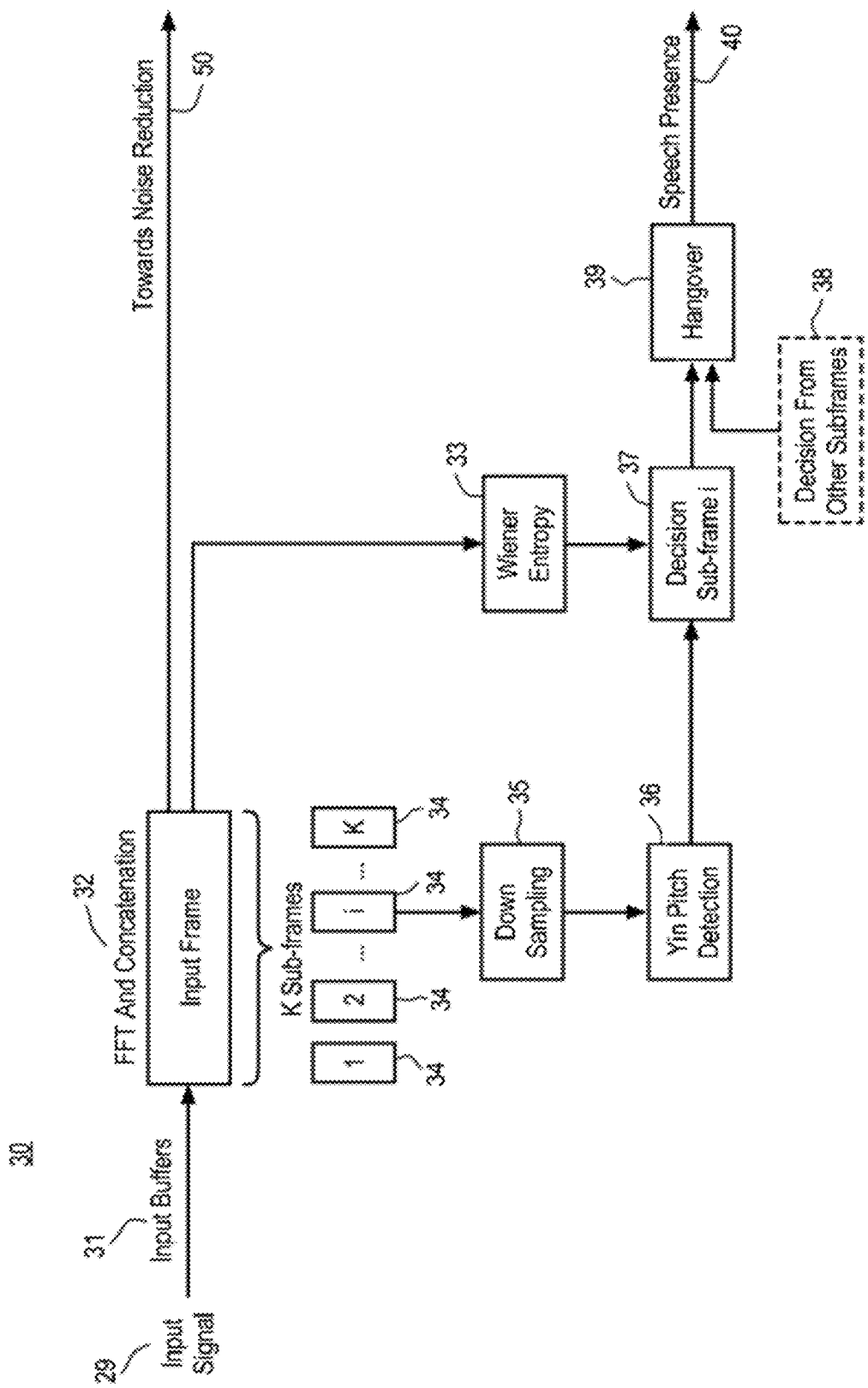
FIG. 9 is a schematic diagram of a voice activity detection architecture system including data buffer organization around noise reduction (NR) and voice activity detection (VAD) modules.

FIG. 9 is a schematic diagram of an implementation of method 20 in voice activity detection architecture system 30 in combination with noise sensing architecture system 50. Voice activity detection (VAD) architecture system 30 and noise sensing architecture system (NS) 50 can be implemented in voice aware audio system 10, as shown in FIG. 1, to provide noise robust voice activity detection (VAD). Referring to FIG. 9, input buffer 31 receives input signal 29. Fast Fourier Transform (FFT) and concatenation of input signal 29 in input buffer 31 determines frame 32. Frame 32 can be used in Weiner entropy module 33 to detect candidates. Weiner entropy module 33 performs block 22, as shown in FIG. 7.

Referring, to FIG. 9, frame 32 can also be divided into successive K sub-frames 34. Down sampling process 35 can be used on sub-frames 34 before Yin pitch detection module 36. Yin pitch detection module 36 performs block 24 as shown in FIG. 7. Referring to FIG. 9, Weiner entropy module 33 and Yin detection module 36 determine decision sub-frame 37. Decision sub-frame 37 and decisions from other sub-frames 38 can be introduced into hangover module 39 before determining speech presence module 40. Inside a sentence, one can find areas with low energies and method 20 of the present invention may consider them as non-speech frames. If there are too much interruptions the listening at the output can be annoying. The disruptions can be eliminated by using hangover module 39. Frame 32 can also be forwarded to noise sensing (NS) architecture 50.

Figure 10:
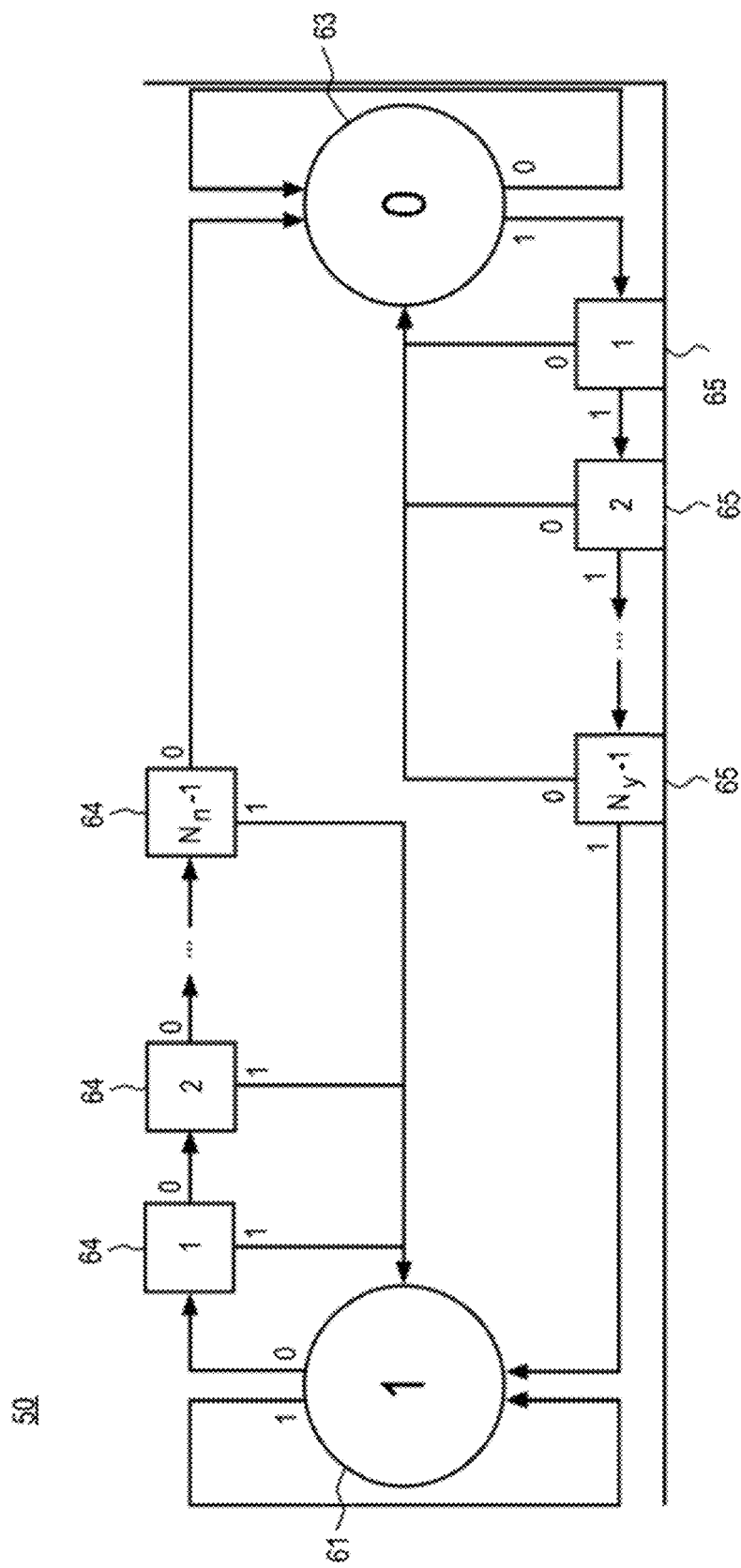
FIG. 10 is a schematic diagram of a state machine diagram of a hangover procedure.

FIG. 10 is a schematic diagram of state machine 60 which can be used in hangover module 39. Permanent state 1 standing for speech presence at hangover module output is depicted by circle 61 and permanent state 0 standing for speech absence at hangover module output is depicted by circle 63. Each arrow decision (0 or 1) coming out from circle 61 and boxes 64 and circle 63 and boxes 65 come after processing a frame. If the decision is the same than as the previous one, then XY or XN is accumulated for respectively speech presence or absence. If not, then they are reset to their initial values 0. Once one of these variables equals NY or NN, switch from one state to another is activated.

In this method or algorithm decVad is denoted the input decision coming from the speech decision module 40 shown in FIG. 9. If one defines a position index idx in the state machine of FIG. 10 and an output decision decHov value associated to the state at that index such that state[0]=0 and state[1]=1.

Figure 11A:
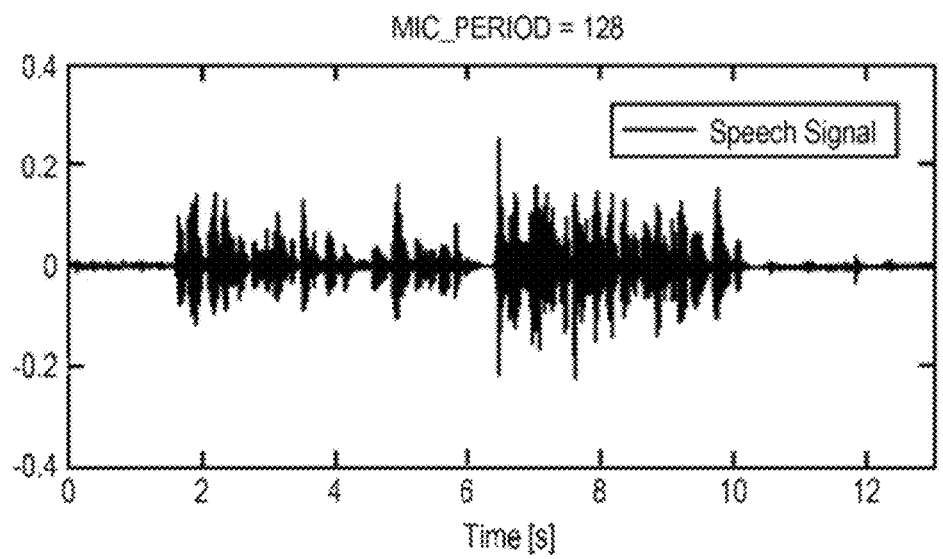
FIG. 11A is a schematic diagram of a speech signal at a 128 buffer length.
Figure 11B:
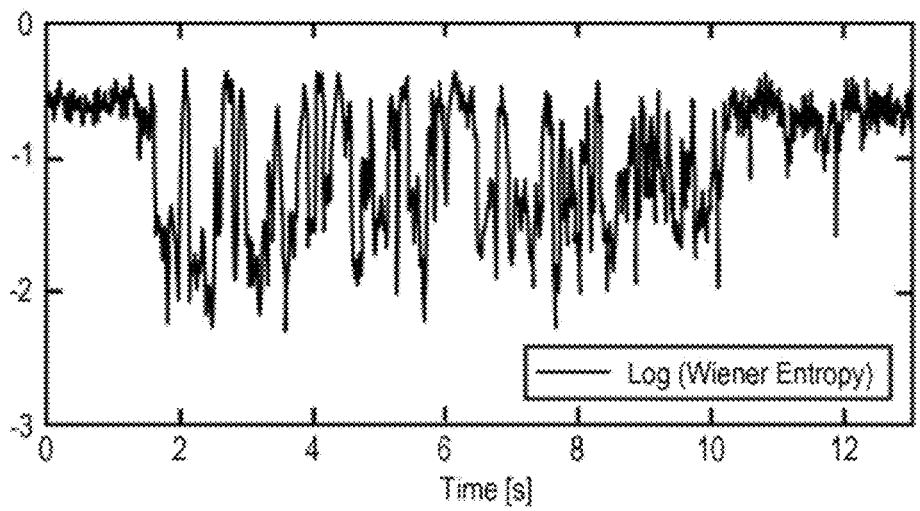
FIG. 11B is schematic diagram of log weiner entropy of the signal shown in FIG. 11A.
Figure 11C:
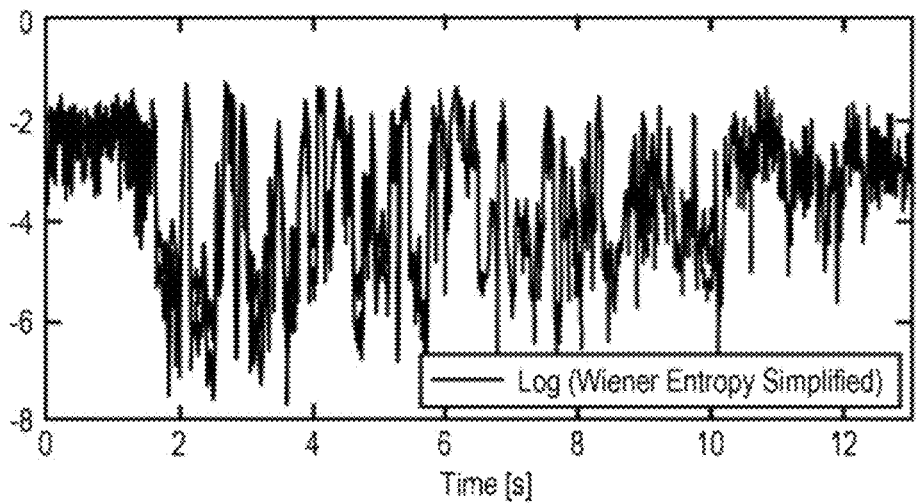
FIG. 11C is schematic diagram of log weiner entropy simplified of the signal shown in FIG. 11A.
Figure 12A:
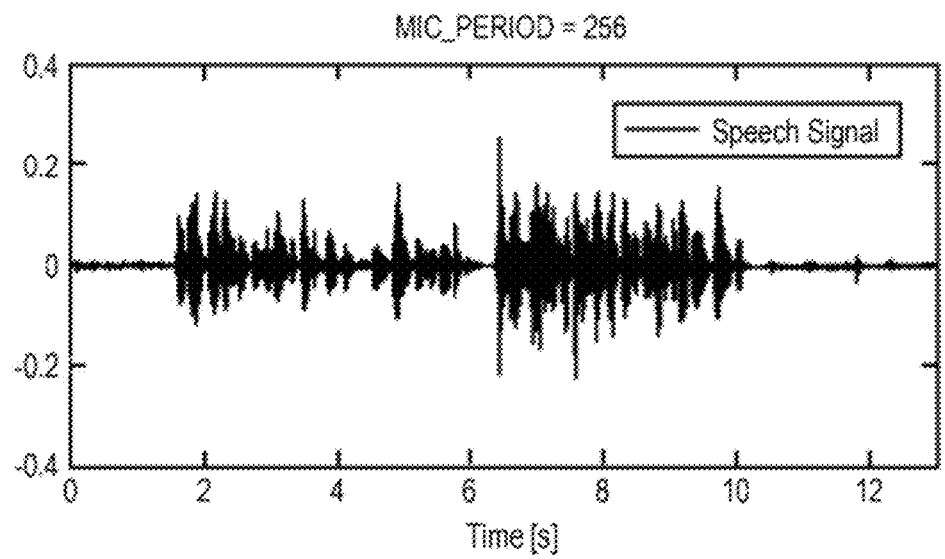
FIG. 12A is a schematic diagram of a speech signal at a 258 buffer length.
Figure 12B:
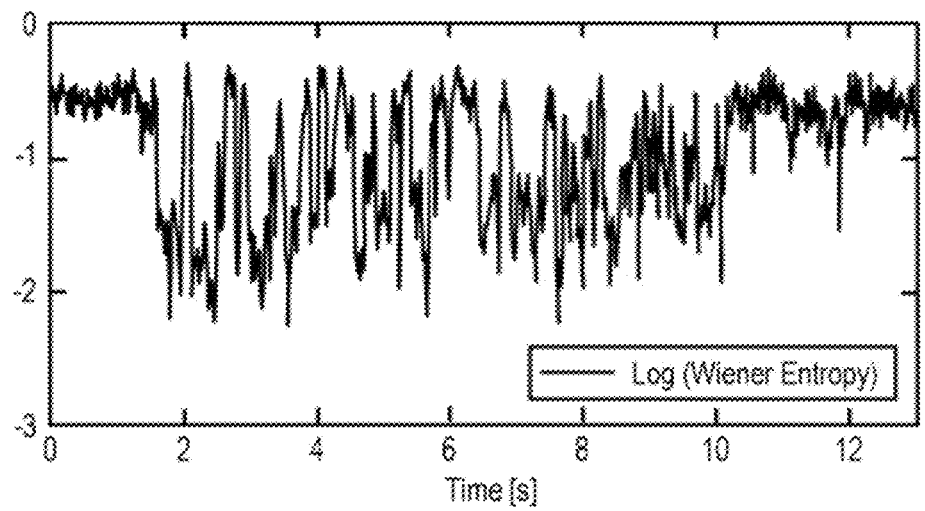
FIG. 12B is a schematic diagram of log weiner entropy of the signal shown in FIG. 12A.
Figure 12C:
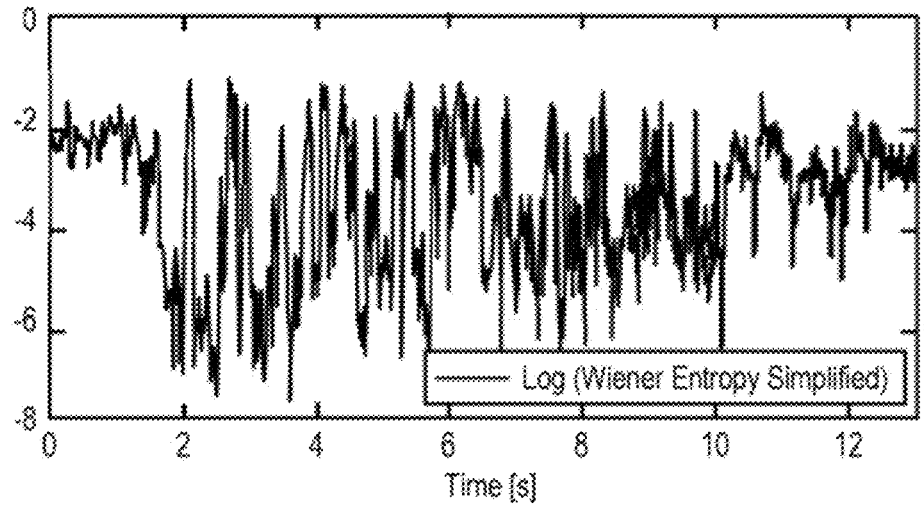
FIG. 12C is a schematic diagram of log weiner entropy simplified of the signal shown in FIG. 12A.
Figure 13A:
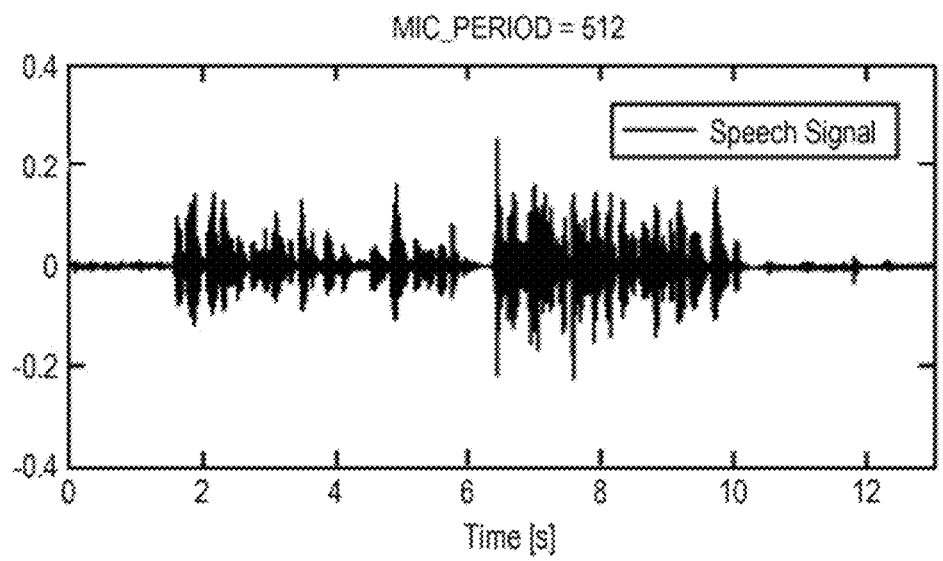
FIG. 13A is a schematic diagram of a speech signal at a 128 buffer length.
Figure 13B:
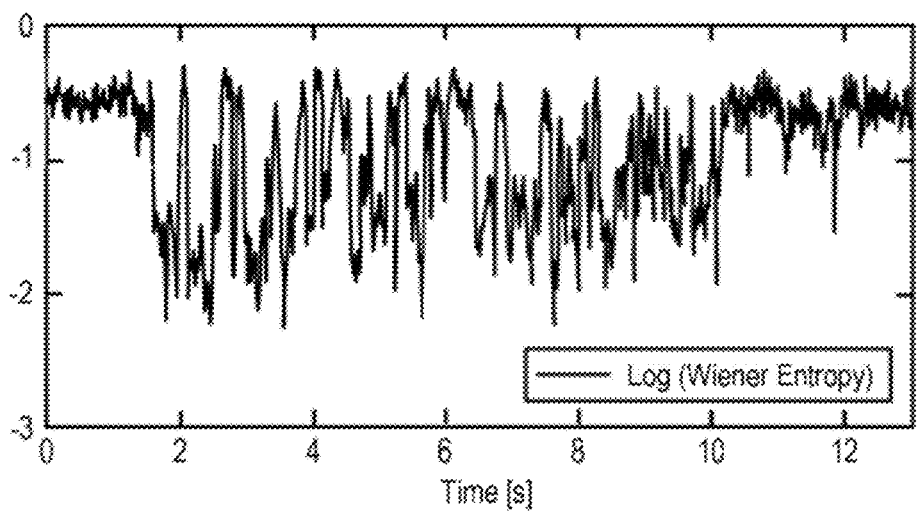
FIG. 13B is a schematic diagram of log weiner entropy of the signal shown in FIG. 13A.
Figure 13C:
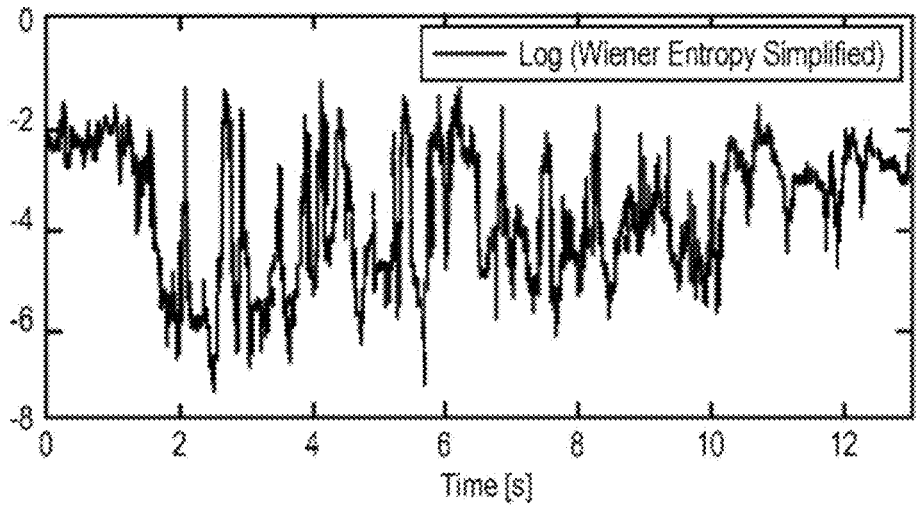
FIG. 13C is a schematic diagram of log weiner entropy simplified of the signal shown in FIG. 13A

FIGS. 11-13 show the influence of the input buffer data on the Wiener entropy value. FIGS. 11A, 12A and 13A show the speech signal at a buffer length respectively of 128, 256 and 512. FIGS. 11B, 12B and 13B show the log Weiner entropy at a buffer length respectively of 128, 256 and 512. FIGS. 11C, 12C and 13C show the log Weiner entropy simplified at a buffer length respectively of 128, 256 and 512. It is shown that increasing the input data buffer length has the effect to smoothen the Wiener entropy curve.

Figure 14:
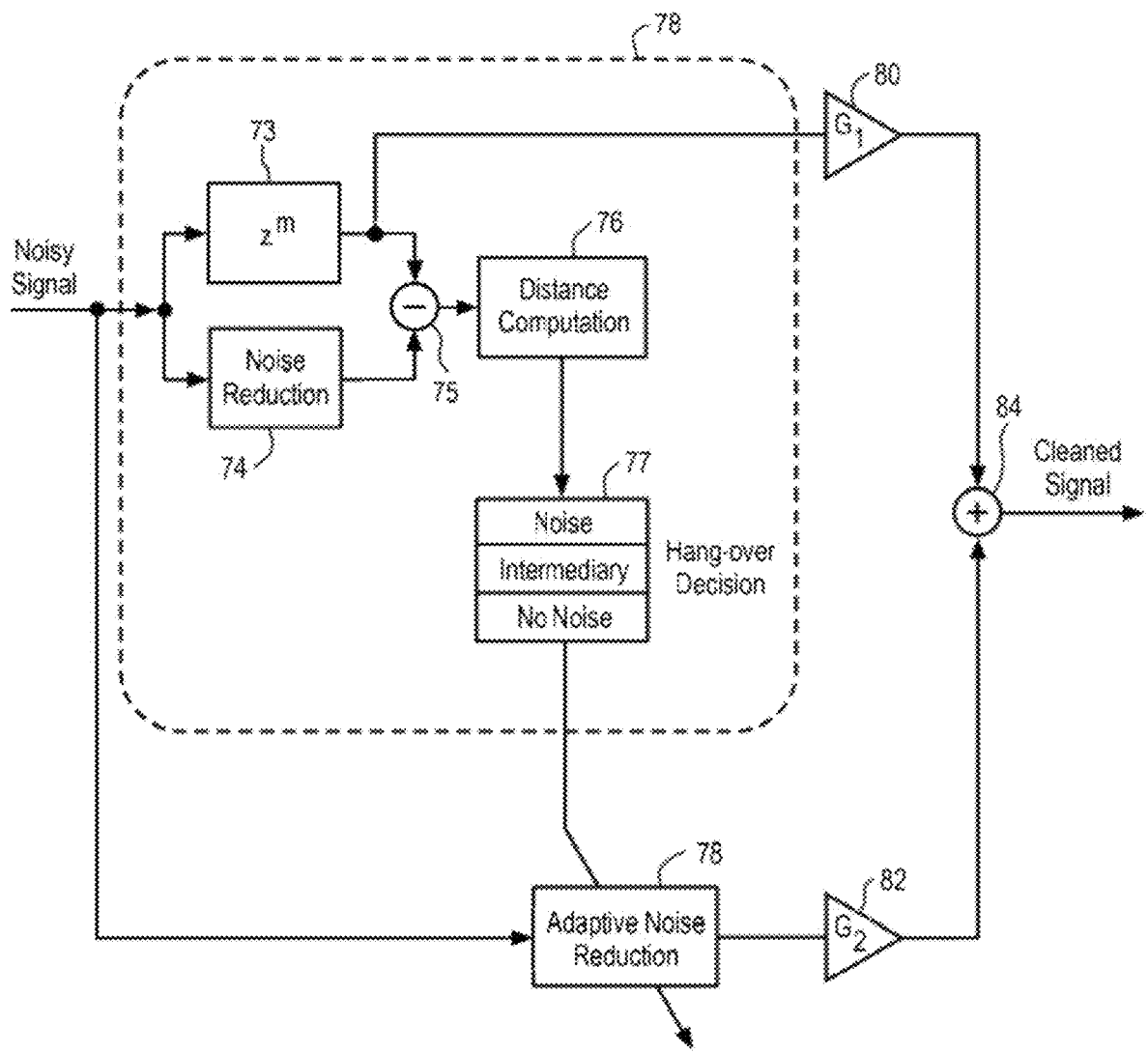
FIG. 14 is a schematic diagram of an adaptive noise reduction module in accordance with the teachings of the present invention.

In one embodiment, noise Sensing (NS) architecture 50 optimizes for all possible noise levels to provide noise reduction (NR) audio quality output while preventing as much as possible, the apparition of the musical noise. Output 51 of noise sensing (NS) can be used in adaptive noise reduction (NR) module 70 as depicted in FIG. 14. Noise energy sensing architecture system 72 is used to estimate noise with module 73 and noise reduction module 74 which output is combined with combiner 75. The amount of noise is estimated by a noise reduction module 74 which drives the choice of noise reduction (NR) algorithm parameters. Distance computation module 76 can determine a distance between the sensed noise and headphone 12.

Output from distance computation module 76 is used in hangover decision module 77. In order to control the frequency of switching between noise levels states, three noise levels states have been defined as noise, intermediary and no noise which are determined in hangover decision module 77 such that voice aware audio system 10 is not switched over for sudden or impulsive noises. Adaptive noise reduction module 78 processes the signal from hangover decision module 77 to reduce noise. Both raw signal G1 80 and processed signal 82 G2 are mixed in mixer 84 to provide clean signal 85 and transmitted to voice activity determination (VAD) architecture system 30 with the adaptive convex linear combination:

$$y = G1x1 + (1-G1)x2,$$

where x1 is the raw microphone input, x2 is the NR module output and y is the input of the VAD module.

G1 depends on the root mean square (RMS) value $\xi$ which can be computed either in a time or frequency domain.

NR algorithms can be adjusted and their corresponding internal setting parameters with the objective to limit musical noise and audio artefacts to the minimum while reducing ambient noise to the maximum.

Figure 15A:
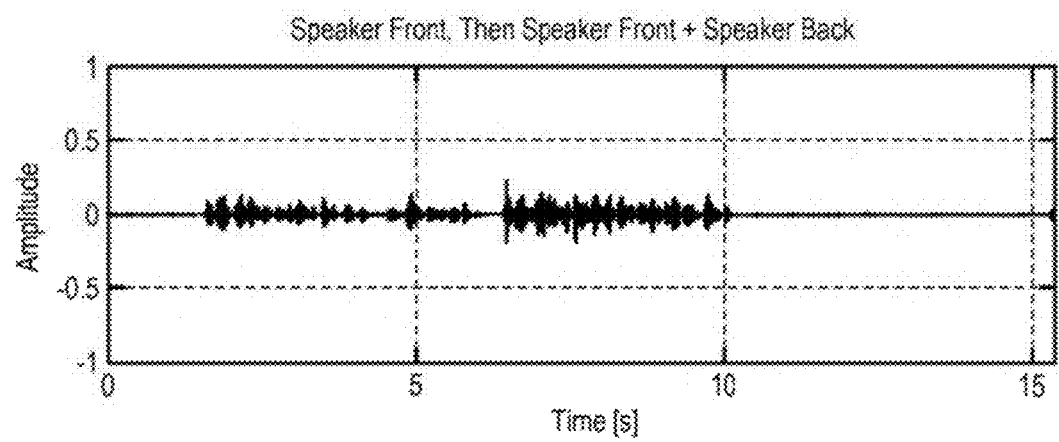
FIG. 15A is a schematic diagram of an input signal including noise.
Figure 15B:
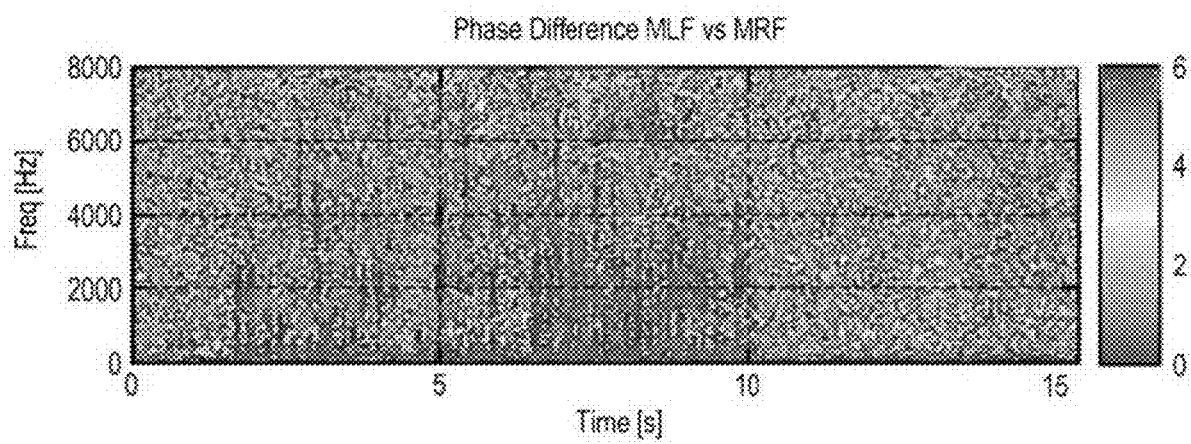
FIG. 15B is a schematic diagram of a phase difference of a microphone left front and a microphone right front.
Figure 15C:
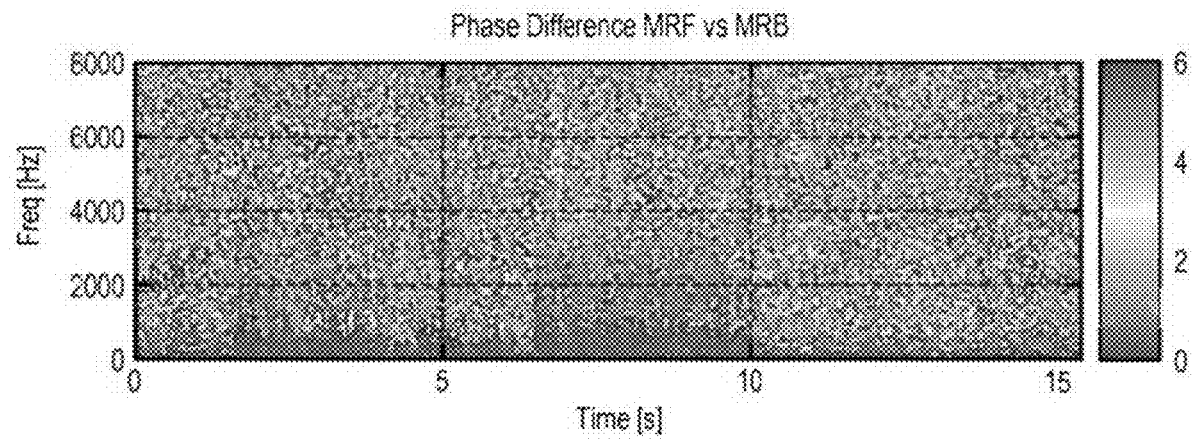
FIG. 15C is a schematic diagram of a microphone right front and a microphone right back.

In one embodiment, voice aware audio system 10 can include headphone 12 having a microphone array and for example a four-channel procedure. An advantage of multiple channel procedure is that it brings innovative features that increase the efficiency. Because a speaker is localized in space, the propagation of its voice sound to the microphone array follows a coherent path, in opposition to diffuse noise. Typically, the voice picked up on one microphone is a delayed replica of what is recorded on a second microphone. FIG. 15A-15C illustrate phase difference patterns. The signal is a four-channel recording microphone array first track depicted which timing is the following: one speaker in front (from about 2 seconds to about 6 seconds) and two speakers, one in front and one in back (from about 6 seconds to about 10 seconds). Noise has been artificially added to the input signal as shown in FIG. 15A. Phase difference between MLF and MLB (broadside) is shown in FIG. 15B and phase difference between MRF and MRB (end-fire) I shown in FIG. 15C. It is shown for both arrays that phase difference patterns do not look similar when speech is present or absent.

The microphone array can act as a spatial filter to attenuate sounds coming from non-desired directions while enhancing sounds coming from the selected one(s). The use of a microphone array can help to improve sound quality and/or increase VAD noise robustness and detection accuracy.

Figure 16:
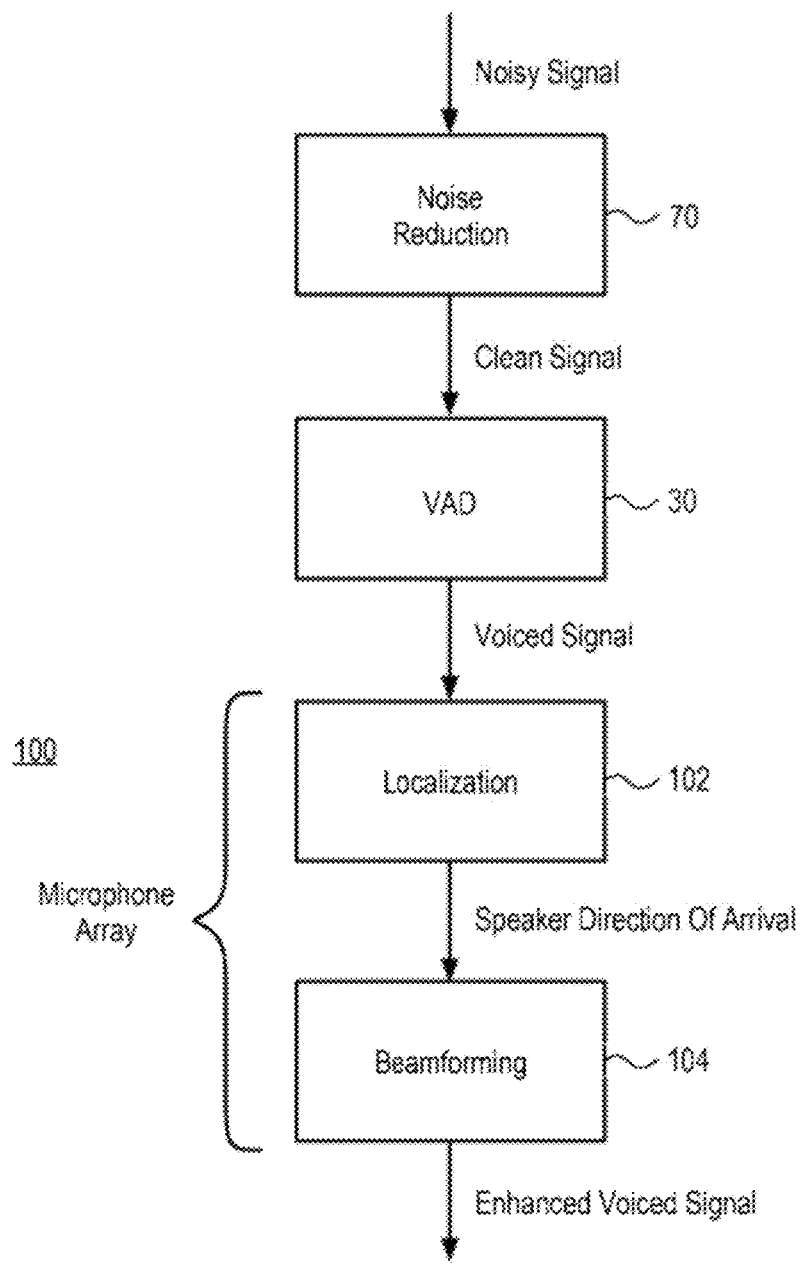
FIG. 16 is a flow diagram of a method to improve voice activity detection (VAD) output quality including localization and beamforming using a microprocessor array.

FIG. 16 illustrates an implementation of voice aware audio system 10 including noise sensing architecture system 50 receiving a noisy signal and determining a clean signal. The clean signal is used in voice activity detection architecture system 30. Microphone array 100 can be used with localization module 102 and beamforming module 104.

Once voice is detected in one direction at one of microphones 15 in microphone array 100, localization module 102 localizes a speaker direction of arrival. Beamforming module 104 steers the microphone detecting the voice towards the determined direction and consequently, attenuates noise coming from other directions. Beamforming module 104 provides an enhanced voice signal delivered to speakers 17 of headphone 12 as shown in FIG. 6, with statistically and spatially attenuated external noise.

In an alternate embodiment, noise is coming from all directions. For example, noise can occur in all directions in a train, plane, boat and the like where noise is mainly due to the motor engine with no precise direction of arrival because of the cabin sound reverberation. Conversely, a speaker of interest, is always located in a single point of space. Reverberation is rarely a problem because of the proximity of the speaker for example a few meters max.

Figure 17:
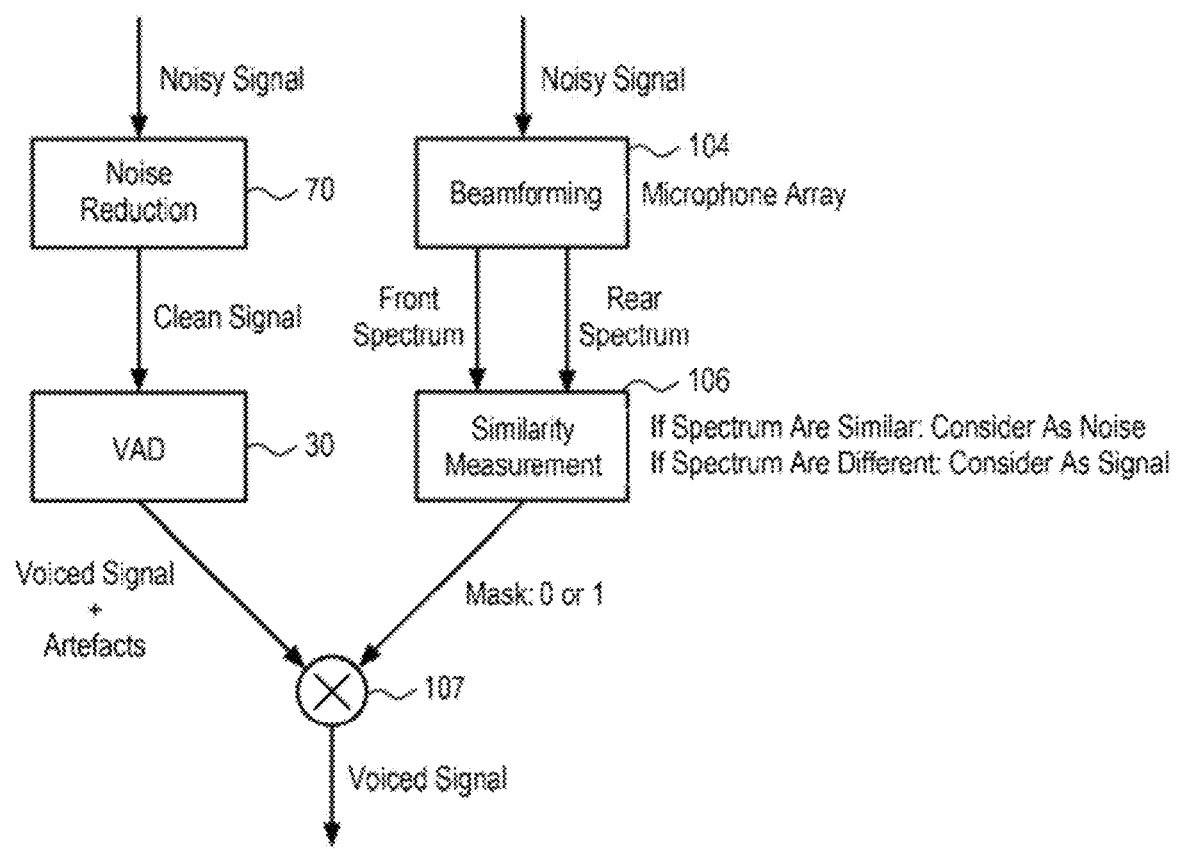
FIG. 17 is a schematic diagram to improve the robustness of voice activity detection (VAD) against diffuse noise.

FIG. 17 illustrates an implementation of voice aware audio system 10 including noise sensing architecture system 50 receiving a noisy signal and determining a clean signal and the use the microphone array to take advantage of the difference between noise and a signal. In parallel to noise reduction (NR) module 70 and voice activity detection architecture system 30, an incoming signal coming from a different direction, such as for example front and rear, are compared are received in beamforming module 104 and compared in similarity module 106. If speech is present, a difference between the two spectrums should be observed considering that the speaker cannot be placed on multiple positions at the same time. If speech is absent, a low difference between spectrums, can be observed considering noise is more or less the same whatever the direction the headphone is looking to. A signal determined in similarity module 106 can be combined in mixer 107 with a voiced signal and possible artefacts from voice activity detection architecture system 30. Using such a similarity-based feature can help in eliminating false alarm of voice activity detection architecture system for increasing its robustness to noise.

Figure 18:
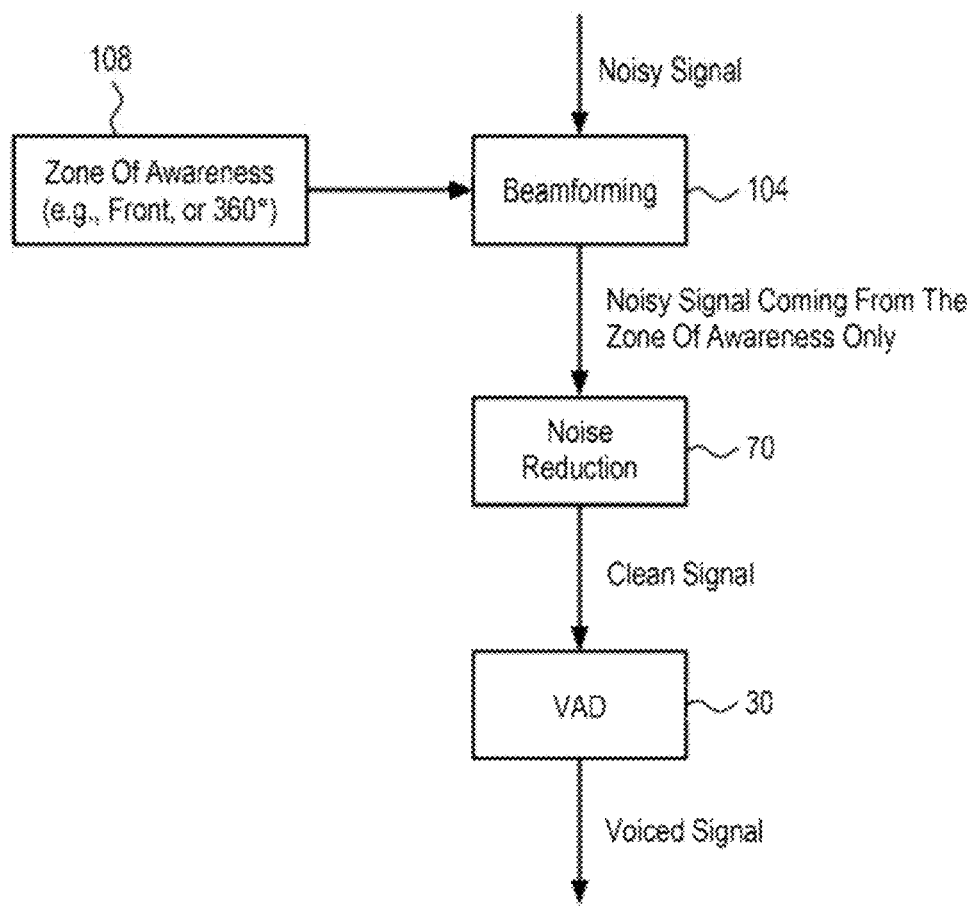
FIG. 18 is a flow diagram of a method to increase the robustness of voice activity detection (VAD) against unwanted voices in a zone of awareness.

FIG. 18 illustrates an implementation of voice aware audio system 10 including cancelling of unwanted voices in a case where multiple speakers are placed around the user. The user wants to speak with one speaker from a specific direction, for example the front. Microphone array 100 can be used with a zone of awareness 108 to remove all signals coming from non-desired directions in beamforming module 104 to pre-process signals into a noisy signal coming from the zone of awareness only before entering into noise reduction (NR) module 70 and voice activity detection architecture system 30.

It is preferable that voice awareness audio system 10 ensures high intelligibility. As the user is interrupted by an external voice, it is desirable to keep the music level constant and add the external voice while ensuring the user hears clearly the voice message. This advantage can be achieved by controlling both voice false alarms detections and listening conditions. Voice false alarms can be determined voice activity detection architecture system 30. In one embodiment, the present invention provides mixing external speech detected by voice activity detection architecture system 30 with music coming from headphone 12 as shown in FIG. 6.

It is desirable to ensure the speaker voice delivered by headphones 12 is well understood by the user. In one embodiment muting or at least reducing music sound level while speech is detected and transmitted. Mixing strategies for improving the voice intelligibility can include adaptive spectral equalization; spatial dissociation; and studio-inspired ad-hoc processing which can be processed separately or together.

Listening to a speech signal mixed with music drastically decreases its intelligibility, especially when music already contains vocal signal. There is evidence from many sources that increasing the signal-to-noise ratio (SNR) onto speech fundamental frequency increases the speech understanding. By extension, the higher the SNR for all the harmonics, the better.

In the present invention spectral and temporal information for both voice coming from voice activity detection (VAD) architecture system 30 and music played by the user in headphone 12 are available. In one embodiment, energy of both signals can be compared, especially in the fundamental frequency and associated harmonics bands, and the signals from voice activity detection (VAD) architecture system 30 are increased if they are relatively low when compared to music.

Figure 19:
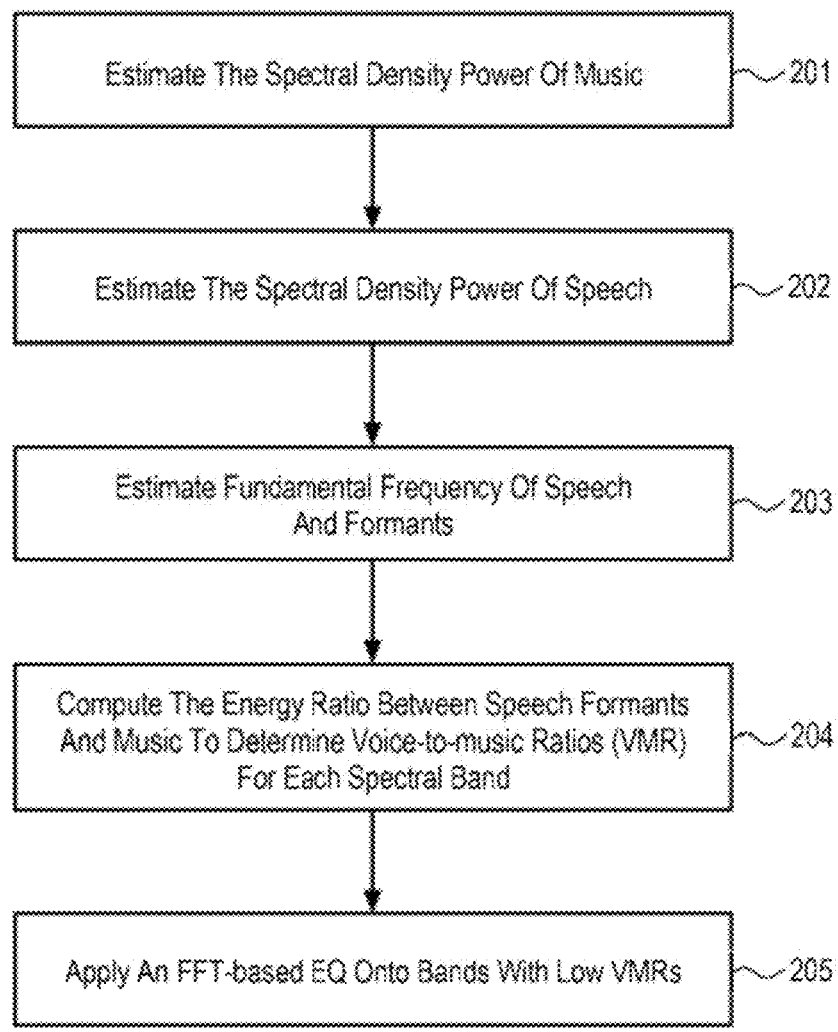
FIG. 19 is a flow diagram of a method for implementing the voice aware audio system including adaptive spectral equalization.

FIG. 19 illustrates an implementation of voice aware audio system 10 including adaptive spectral equalization method 200. Each time voice is detected, adaptive spectral equalization method 200 can be performed. In block 201, an estimate is determined of a spectral density power of music. In block 202, an estimate is determined of a spectral density power of speech. In block 203, an estimate of fundamental frequency of speech and formants from block 202 is determined. In block 204, an energy ratio is computed between speech formants from block 203 and music form block 201 to determine voice-to-music ratios (VMR) for each spectral band. In block 205, an FFT-based equalizer (EQ) is applied onto bands with low VMRs determined from block 204.

Figure 20A:
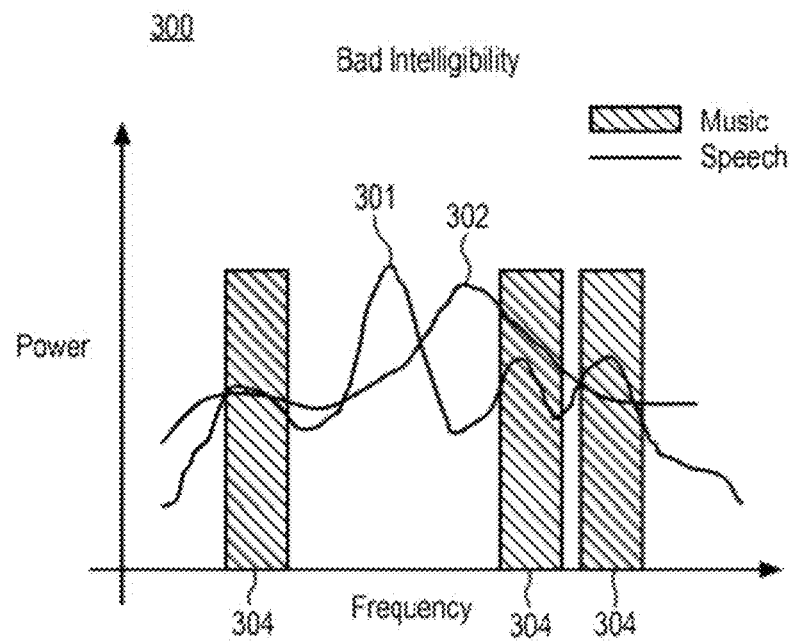
FIG. 20A is a graph of music with bad intelligibility of speech.
Figure 20B:
FIG. 20B is a graph of music with good intelligibility of speech using an adaptive EQ concept.
Figure 20B:
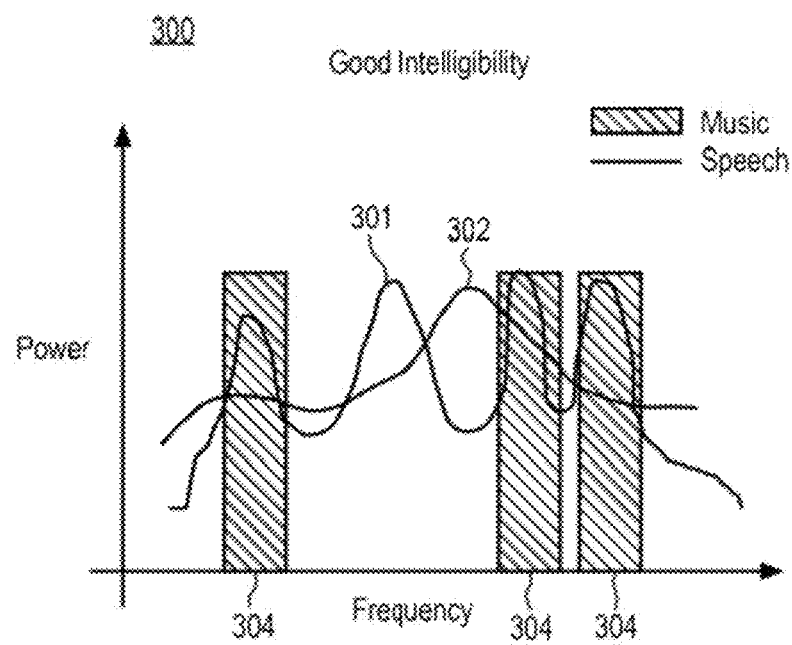

FIG. 20A illustrates graph 300 of power and frequency for speech spectrum 301 compared with music spectrum 302 having bad intelligibility. For bands 304 where the energy of voice formants is low relatively to music determined by block 204, an FFT-based equalizer is applied in block 205 to enhance them. FIG. 20B illustrates graph 300 of power and frequency for speech spectrum 301 compared with music spectrum 302 having good intelligibility after enhancement.

Figure 21A:
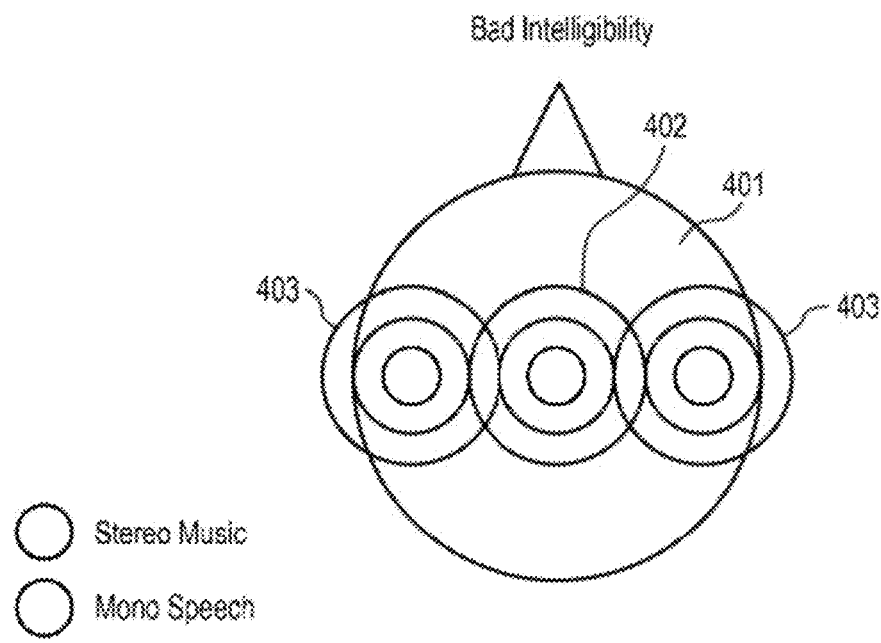
FIG. 21A is a schematic diagram of bad intelligibility of speech.
Figure 21B:
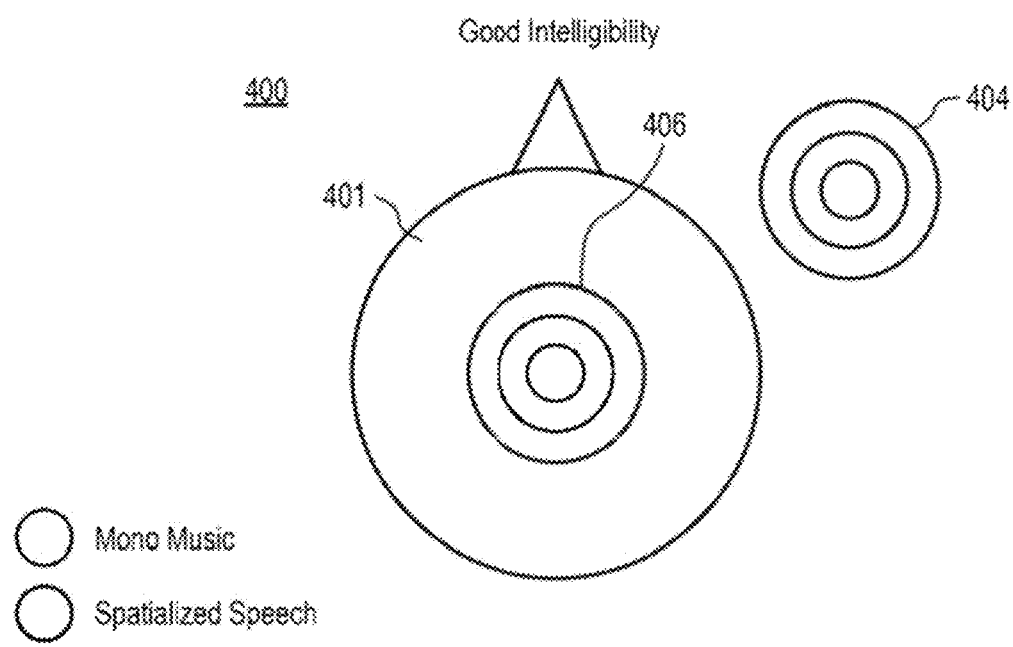
FIG. 21B is a schematic diagram of good intelligibility of speech achieved using a HRTF-based intelligibility improvement concept.

FIG. 21A-21B illustrates an implementation of voice aware audio system 10 including spatial dissociation 400. This strategy assumes that, once a signal of interest is detected, this latter can be localized using the embedded microphone array. For example, via cross-correlation-based methods. FIG. 21A illustrates bad intelligibility with mono speech at position 402 and stereo music at positions 403.

According to the speaker direction of arrival, an HRTF-based filter is applied to signal delivered by the voice activity detection (VAD) 30 to externalize it according to the real speaker position (3D Effect).

This allow user 401 to separate sound signals in space. As shown in FIG. 20B illustrating good intelligibility music will be perceived in the center of the head at position 406 while speech will be perceived outside of the head at position 404. In the same time, the music could temporarily be switched from stereo to mono. Restoring spatial hearing is known to significantly increase the speech intelligibility.

Figure 22:
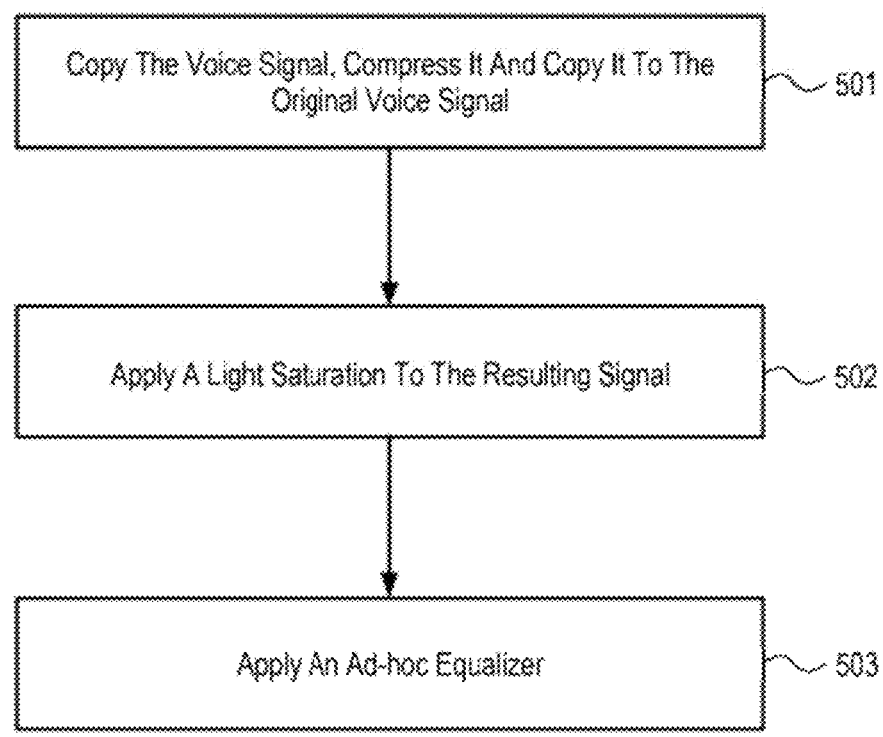
FIG. 22 is a flow diagram of a method of ad-hoc processing using compression-based processing.

FIG. 22 illustrates an implementation of voice aware audio system 10 including compression-based processing 500 to raise the presence of voice when mixed with music, an ad-hoc processing algorithm can be used. In block 501, the voice signal is copied, compressed and then the compressed signal is copied to the original voice signal. In block 502, light saturation is applied to the resulting signal. In block 503, an ad-hoc equalizer is applied.

In block 501, compression reduces inter-phoneme intensity differences, so that the temporal masking is reduced and speech loudness is increased. The summation of both compressed and original voice signals ensure the voice still sounds natural. Block 502 brings more harmonics. It is known for example that fundamental frequency (F0), as well as F1 and F2 harmonic informations are critically important for vowel identification and consonant perception.

Block 5033 aims at cleaning the voice signal by removing low frequency noise and increase frequency bands of interest, for example: low cut −18 dB/octave up to 70 Hz, −3 dB around 250, −2 dB around 500 Hz, +2.5 dB around 3.3 kHz and +7 dB around 10 kHz.

Figure 23A:
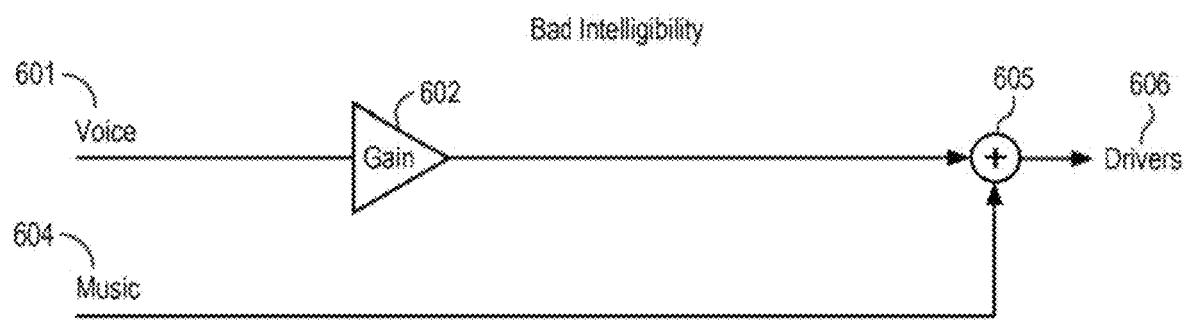
FIG. 23A is a schematic diagram of processing resulting in bad intelligibility.
Figure 23B:
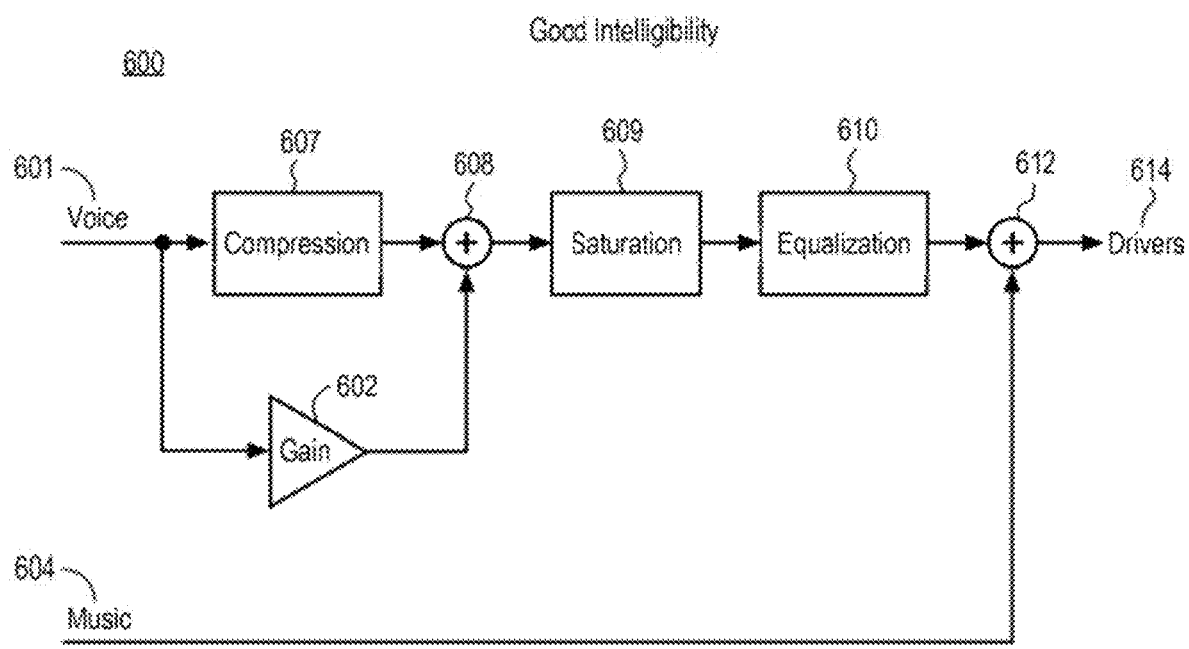
FIG. 23B is a schematic diagram of an implementation of ad-hoc processing using compression-based processing to provide good intelligibility.

FIG. 23A illustrates bad intelligibility with the gain 602 of voice signal 601 being combined with music signal 604 in mixer 605 to provide input 606 to drivers. FIG. 23B illustrates system 600 implementing compression-based processing 500. Voice signal 601 is applied to compression module 607 to provide a compressed signal. The compressed signal is combined with gain 602 of voice signal 601 in mixer 608. Output of mixer 608 is applied to saturation module 609 to perform light saturation of block 502 and equalization module 610 to apply an ad-hoc equalizer. Output of equalization module 610 being combined with music signal 604 in mixer 612 to provide input 614 to drivers The noise-robust VAD method or algorithm of the present invention uses a select-then-check strategy approach. First step is done in the frequency domain with a relatively large input buffer which allows to reduce the impact of noise. Voiced speech signal presence is detected via a multiband Wiener entropy feature and shown how computational complexity can be reduced without harming the properties of the classic Wiener entropy.

Second part of the algorithm is done in the time domain with a simplified version of the YIN algorithm where pitch estimation has been replaced by its simple detection. In order to reduce further the computational complexity, an absolute value difference is used instead of the classical squared difference. This algorithm runs over successive subframes along the total input frame.

The present invention provides a derivation of an adjustable sound awareness zone system: Using the amplitude of the input signal and some features that help to distinguish between the user and distant external voices, the system allows the user to define a spherical area around his head where normal voices can be taken into account by the VAD algorithm. If a user is talking with a normal voice volume outside of this sphere then the system will reject it.

The present invention provides derivation of a noise sensing system.

The noise reduction method or algorithm as well as the other main modules like VAD and the array processing algorithms may suffer from the fact that their internal settings can't handle easily all the possible noise levels from quiet situations to very noisy ones. To improve the performances of our system, a noise sensing mechanism of the present invention is derived and it is shown how its integration in the system of the present invention improves significantly the performances of the noise reduction and the VAD algorithms. Indeed, the noise sensing allows a reconfigurable algorithmic architecture with self-adjustable internal parameters including the following inter-actively related modules: VAD; Noise reduction; Voice localization and Beamforming using a microphone array system; and Computational complexity reduction of different algorithms.

The present invention shows how computational complexity burden can be significantly reduced. This either reduces the power consumption or gives more room for further processing. The present invention provides derivation of audio mixing schemes which is done under the constraints of keeping the music volume constant while increasing the voice intelligibility.

Alternative embodiments of the invention may be implemented as pre-programmed hardware elements, other related components, or as a combination of hardware and software components, including hardware processors. Embodiments of the present invention may be implemented in connection with a special purpose or general purpose processor device that include both hardware and/or software components, or special purpose or general purpose computers that are adapted to have processing capabilities.

Embodiments may also include physical computer-readable media and/or intangible computer-readable media for carrying or having computer-executable instructions, data structures, and/or data signals stored thereon. Such physical computer-readable media and/or intangible computer-readable media can be any available media that can be accessed by a general purpose or special purpose computer. By way of example, and not limitation, such physical computer-readable media can include RAM, ROM, EEPROM, CD-ROM or other optical disk storage, magnetic disk storage or other magnetic storage devices, other semiconductor storage media, or any other physical medium which can be used to store desired data in the form of computer-executable instructions, data structures and/or data signals, and which can be accessed by a general purpose or special purpose computer. Within a general purpose or special purpose computer, intangible computer-readable media can include electromagnetic means for conveying a data signal from one part of the computer to another, such as through circuitry residing in the computer.

When information is transferred or provided over a network or another communications connection (either hardwired, wireless, or a combination of hardwired or wireless) to a computer, hardwired devices for sending and receiving computer-executable instructions, data structures, and/or data signals (e.g., wires, cables, optical fibers, electronic circuitry, chemical, and the like) should properly be viewed as physical computer-readable mediums while wireless carriers or wireless mediums for sending and/or receiving computer-executable instructions, data structures, and/or data signals (e.g., radio communications, satellite communications, infrared communications, and the like) should properly be viewed as intangible computer-readable mediums. Combinations of the above should also be included within the scope of computer-readable media.

Computer-executable instructions include, for example, instructions, data, and/or data signals which cause a general purpose computer, special purpose computer, or special purpose processing device to perform a certain function or group of functions. Although not required, aspects of the invention have been described herein in the general context of computer-executable instructions, such as program modules, being executed by computers, in network environments and/or non-network environments. Generally, program modules include routines, programs, objects, components, and content structures that perform particular tasks or implement particular abstract content types. Computer-executable instructions, associated content structures, and program modules represent examples of program code for executing aspects of the methods disclosed herein.

Embodiments may also include computer program products for use in the systems of the present invention, the computer program product having a physical computer-readable medium having computer readable program code stored thereon, the computer readable program code comprising computer executable instructions that, when executed by a processor, cause the system to perform the methods of the present invention.

It is to be understood that the above-described embodiments are illustrative of only a few of the many possible specific embodiments, which can represent applications of the principles of the invention. Numerous and varied other arrangements can be readily devised in accordance with these principles by those skilled in the art without departing from the spirit and scope of the invention.

What is claimed is:

1. A voice aware audio system comprising:
    a headphone configured to receive audio data from an audio source;
    an array of microphones configured to detect outer sound waves in an outer sound environment and to generate an outer sound signal directed to the outer sound waves;
    an analyzer module configured to determine if the outer sound signal directed to the outer sound waves is a signal of interest;
    a mixer configured to, when the outer sound signal directed to the outer sound waves is determined to be a signal of interest, mix the outer sound signal directed to the outer sound waves with an audio signal based on the audio data from the audio source to generate a mixed signal; and
    one or more speakers configured to generate output sound based on the mixed signal,
    an adjustable sound awareness zone being defined around the headphone, the adjustable sound awareness zone having one or more tuning zones, the analyzer module being further configured to determine that the outer sound signal directed to the outer sound waves is a signal of interest when the outer sound waves are within a predetermined one of the one or more tuning zones, and the voice aware system being configured to remove unwanted sound waves coming from non-desired directions and capture desired sound waves coming from a direction of interest.

2. The voice aware audio system of claim 1 wherein the analyzer module is further configured to analyze the outer sound signal directed to the outer sound waves in a frequency domain to select an oscillating frequency candidate and in a time domain to determine if the oscillating frequency candidate is the signal of interest.

3. The voice aware audio system of claim 2 wherein the analyzer module is further configured to receive the outer sound signal directed to the outer sound waves, in the frequency domain use an FFT of the outer sound signal directed to the outer sound waves to generate an input frame, and in the time domain recursively use sub-frames with the input frame.

4. The voice aware audio system of claim 3 wherein the analyzer module is further configured to, in the frequency domain, use Weiner entropy or Weiner entropy simplified.

5. The voice aware audio system of claim 3 wherein the analyzer module is further configured to, in the time domain, use a pitch estimation or YIN algorithm.

6. The voice aware system of claim 2 wherein the analyzer module is further configured to, in the frequency domain, use a noise reduction algorithm to estimate a noise level in the outer sound environment and to tune the voice aware audio system based on the noise level.

7. The voice aware audio system of claim 1 wherein the analyzer module further comprises a hangover module configured to determine speech presence or speech absence in the signal of interest determined in the time domain.

8. The voice aware audio system of claim 1 wherein
    an adjustable sound awareness zone is defined around the headphone, the adjustable sound awareness zone having one or more tuning zones, and
    the analyzer module is further configured to determine that the outer sound signal directed to the outer sound waves is a signal of interest when the outer sound waves are within a predetermined one of the one or more tuning zones.

9. The voice aware audio system of claim 1 wherein the audio signal includes a music signal.

10. The voice aware audio system of claim 1 wherein the array of microphones are steered to attenuate or amplify audio sound waves coming from a selected direction, the microphones of the array of microphones being physically arranged in various directions to achieve a 360° audio image of the outer sound environment.

11. A method comprising:
    receiving audio data from an audio source;
    detecting outer sound waves in the outer sound environment with an array of microphones;
    generating an outer sound signal directed to the outer sound waves;
    determining if the outer sound signal directed to the outer sound waves is a signal of interest;
    if the outer sound signal directed to the outer sound waves is determined to be a signal of interest, mixing the outer sound signal directed to the outer sound waves with an audio signal based on the audio data from the audio source to generate a mixed signal; and
    generating an output sound based on the mixed signal,
    an adjustable sound awareness zone being defined around the headphone, the adjustable sound awareness zone having one or more tuning zones, the determining if the outer sound signal directed to the outer sound waves is a signal of interest including determining if the outer sound signal directed to the outer sound waves is a signal of interest when the outer sound waves are within a predetermined one of the one or more tuning zones, and further comprising removing unwanted sound waves coming from non-desired directions and capturing desired sound waves coming from a direction of interest.

12. The method of claim 11 further comprising analyzing the outer sound signal directed to the outer sound waves in a frequency domain to select an oscillating frequency candidate and in a time domain to determine if the oscillating frequency candidate is the signal of interest.

13. The method of claim 12 wherein the analyzing in the frequency domain includes using Weiner entropy or Weiner entropy simplified.

14. The method of claim 12 wherein the analyzing in the time domain includes using a pitch estimation or YIN algorithm.

15. The method of claim 12 further comprising determining speech presence or speech absence in the signal of interest determined in the time domain.

16. The method of claim 11 further comprising
estimating a noise level in the outer sound environment; and
tuning based on the noise level to determine if the outer sound signal directed to the outer sound waves is a signal of interest.

17. The method of claim 11 further comprising
defining an adjustable sound awareness zone around the headphone, the adjustable sound awareness zone having one or more tuning zones, and
determining that the outer sound signal directed to the outer sound waves is a signal of interest when the outer sound waves are within a predetermined one of the one or more tuning zones.

18. The method of claim 11
wherein the at least one microphone is an array of microphones,
further comprising localizing a direction of the sound and steering the array of microphones towards the localized direction.

19. The method of claim 11 further comprising:
capturing a first instance of the outer sound signal directed to the outer sound waves from a first microphone in the array of microphones and capturing a second instance of the outer sound signal directed to the outer sound waves from a second microphone in the array of microphones; and
comparing the first instance of the outer sound signal directed to the outer sound waves from the first microphone and the second instance of the outer sound signal directed to the outer sound waves from the second microphone, wherein if the comparison meets a condition then performing the step of mixing the signal.

20. The method of claim 11 further comprising removing unwanted sound signals directed to unwanted outer sound waves coming from non-desired directions in the adjustable sound awareness zone.

21. The method of claim 11 wherein the audio signal includes a music signal and further comprising:
estimating a spectral density power of the music signal;
estimating a spectral density power of speech in the outer sound signal directed to the outer sound waves;
estimating a fundamental frequency of the speech to determine speech formants;
computing an energy ratio between the speech formants and the spectral density power of the music signal to determine voice-to-music ratios (VMR) for each of a plurality of spectral bands; and
applying an FFT-based equalizer (EQ) onto the plurality of spectral bands with a predetermined VMR.

22. A non-transitory computer readable storage medium storing program instructions for causing a processor to mix a sound in an outer sound environment with audio from an audio source, the program instructions comprising:
program code for receiving audio data from an audio source;
program code for detecting outer sound waves in the outer sound environment with an array of microphones;
program code for generating an outer sound signal directed to the outer sound waves;
program code for determining if the outer sound signal directed to the outer sound waves is a signal of interest, an adjustable sound awareness zone being defined around the headphone, the adjustable sound awareness zone having one or more tuning zones, the program code for determining if the outer sound signal directed to the outer sound waves is a signal of interest including program code for determining when the outer sound waves are within a predetermined one of the one or more tuning zones;
program code for removing unwanted sound waves coming from non-desired directions;
program code for capturing desired sound waves coming from a direction of interest; and
program code for mixing the outer sound signal directed to the outer sound waves with an audio signal based on the audio data from the audio source to generate a mixed signal when the outer sound signal directed to the outer sound waves is determined to be a signal of interest.

23. The non-transitory computer readable storage medium of claim 22 wherein the program instructions further comprise program code for analyzing the outer sound signal directed to the outer sound waves in a frequency domain to select an oscillating frequency candidate and in a time domain to determine if the oscillating frequency candidate is the signal of interest.

* * * * *